United States Patent
Choi et al.

(10) Patent No.: US 9,368,445 B2
(45) Date of Patent: Jun. 14, 2016

(54) E-FUSE STRUCTURE OF SEMICONDUCTOR DEVICE

(71) Applicant: SAMSUNG ELECTRONICS CO., LTD., Suwon-si, Gyeonggi-do (KR)

(72) Inventors: Hyun-Min Choi, Uiwang-si (KR); Shigenobu Maeda, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/814,049

(22) Filed: Jul. 30, 2015

(65) Prior Publication Data

US 2015/0340317 A1    Nov. 26, 2015

Related U.S. Application Data

(63) Continuation of application No. 14/503,563, filed on Oct. 1, 2014, now Pat. No. 9,099,469.

(60) Provisional application No. 61/889,911, filed on Oct. 11, 2013.

(30) Foreign Application Priority Data

Feb. 26, 2014   (KR) .................. 10-2014-0022774

(51) Int. Cl.
*H01L 23/525* (2006.01)
*H01L 23/528* (2006.01)
*H01L 23/532* (2006.01)
*H01L 23/522* (2006.01)

(52) U.S. Cl.
CPC .......... *H01L 23/5256* (2013.01); *H01L 23/522* (2013.01); *H01L 23/528* (2013.01); *H01L 23/53214* (2013.01); *H01L 23/53223* (2013.01); *H01L 23/53228* (2013.01); *H01L 23/53233* (2013.01); *H01L 23/53238* (2013.01); *H01L 23/53257* (2013.01); *H01L 23/53261* (2013.01); *H01L 23/53266* (2013.01); *H01L 23/53295* (2013.01); *H01L 2924/0002* (2013.01)

(58) Field of Classification Search
CPC .............. H01L 23/5256; H01L 23/528; H01L 34/53238; H01L 23/522; H01L 23/53266; H01L 23/53261; H01L 23/233; H01L 23/53228
See application file for complete search history.

(56) References Cited

U.S. PATENT DOCUMENTS

| | | | |
|---|---|---|---|
| 6,252,292 | B1 | 6/2001 | Brintzinger et al. |
| 6,746,947 | B2 | 6/2004 | Daubenspeck et al. |
| 7,378,718 | B2 | 5/2008 | Tsutsui |
| 7,605,072 | B2 | 10/2009 | Yang et al. |
| 7,791,164 | B2 | 9/2010 | Nam et al. |

(Continued)

FOREIGN PATENT DOCUMENTS

KR   10-2008-0005720 A    1/2008
KR       10-0827664 B1    4/2008

*Primary Examiner* — William Coleman
(74) *Attorney, Agent, or Firm* — Lee & Morse, P.C.

(57) ABSTRACT

Provided is an e-fuse structure of a semiconductor device. the e-fuse structure may include a fuse link formed of a first metal material to connect a cathode with an anode, a capping dielectric covering a top surface of the fuse link, and a dummy metal plug penetrating the capping dielectric and being in contact with a portion of the fuse link. The dummy metal plug may include a metal layer and a barrier metal layer interposed between the metal layer and the fuse link. The barrier metal layer may be formed of a second metal material different from the first metal material.

19 Claims, 32 Drawing Sheets

(56) References Cited

U.S. PATENT DOCUMENTS

| | | |
|---|---|---|
| 7,867,832 B2 | 1/2011 | Yang et al. |
| 8,299,567 B2 | 10/2012 | Wang et al. |
| 8,384,131 B2 | 2/2013 | Lee et al. |
| 8,421,186 B2 | 4/2013 | Li et al. |
| 8,450,205 B2 | 5/2013 | Hsu et al. |
| 2009/0001506 A1 | 1/2009 | Kim et al. |
| 2012/0249159 A1 | 10/2012 | Fillippi et al. |

E-FUSE STRUCTURE OF SEMICONDUCTOR DEVICE

CROSS-REFERENCE TO RELATED APPLICATIONS

This is a continuation application based on pending U.S. application Ser. No. 14/503,563, filed Oct. 1, 2014, which is based on U.S. provisional application Ser. No. 61/889,911, filed Oct. 11, 2013, the entire contents of both of which is hereby incorporated by reference.

Korean Patent Application No. 10-2014-0022774, filed on Feb. 26, 2014, and entitled: "E-Fuse Structure of Semiconductor Device," is incorporated by reference herein in its entirety.

BACKGROUND

1. Field

One or more embodiment described herein relate to an e-fuse structure of a semiconductor device.

2. Description of the Related Art

A fuse has been used for various purposes in semiconductor chip fabrication and design. For example, in a memory device, a fuse has been used to replace a defective memory cell with a redundancy memory cell during a repair process. This replacement helps increase manufacturing yield. A fuse has also been used to record the fabrication history of a chip during a chip identification process. A fuse has also been used to optimize the characteristics of a chip in a post fabrication operation of a chip customization process.

A fuse may be classified as a laser fuse or an e-fuse. In a laser fuse, a laser beam is used to sever an electrical connection. In an e-fuse, an electric current is used for this purpose.

SUMMARY

In accordance with one embodiment, an e-fuse structure of a semiconductor device includes a fuse link of a first metal material to connect a cathode and an anode; a capping dielectric covering a top surface of the fuse link; and a dummy metal plug penetrating the capping dielectric and contacting the fuse link, the dummy metal plug including a barrier metal layer between a metal layer and the fuse link, wherein the barrier metal layer includes a second metal material different from the first metal material. The first metal material may have an electrical conductivity greater than the second metal material.

The first metal material may include at least one of tungsten, aluminum, copper, or a copper alloy, and the second metal material may include at least one of Ta, TaN, TaSiN, Ti, TiN, TiSiN, W, WN, or a combination thereof.

The e-fuse structure is the fuse link is to carry program current, and the fuse link has a void between the anode and the dummy metal plug in a programmed state. A distance between the void and the dummy metal plug may be less than a distance between the void and the anode. A lower width of the dummy metal plug may be less than an upper width of the fuse link.

A lower width of the dummy metal plug may be greater than an upper width of the fuse link, and the dummy metal plug may contact top and side surfaces of the fuse link. The barrier metal layer may cover bottom and side surfaces of the metal layer. The barrier metal layer may be thicker on the bottom surface of the metal layer than on one or both of the side surfaces of the metal layer.

A bottom surface of the dummy metal plug may be between top and bottom surfaces of the fuse link. The metal layer may include a contact portion with a first width and an interconnection portion with a second width greater than the first width. The fuse link may have a width that is substantially equal to or smaller than widths of the anode and the cathode.

The e-fuse structure may include a dummy metal pattern on a top surface of the dummy metal plug, and the dummy metal pattern may have a thickness greater than the fuse link. A plurality of dummy fuse links may be at respective sides of the fuse link, and the dummy metal pattern may have a width less than a distance between the dummy fuse links. A plurality of dummy metal plugs may be between the anode and the cathode.

The dummy metal plug may extend along a direction that is substantially perpendicular to a longitudinal axis of the fuse link. The anode and the cathode may be at different levels, and the fuse link and the dummy metal plug may be between the anode and the cathode. The anode and the cathode may be e at a first level relative to a top surface of an underlying layer, the fuse link may be at a second level relative to the top surface of the underlying layer, and the second level may be higher than the first level.

The e-fuse structure may include a transistor on a semiconductor substrate, and the transistor may include a gate electrode which includes the first metal material and the transistor is at substantially a same level as the fuse link.

The e-fuse structure may include a plurality of metal lines spaced from a semiconductor substrate, and the metal lines may include the first metal material and are at substantially a same level as the fuse link. The fuse link may carry program current, and the dummy metal plug may change a temperature gradient in the fuse link during supply of the program current. The fuse link may include a first region in contact with the dummy metal plug and a second region in contact with the capping dielectric, and a temperature of the fuse link may have a maximum value at the second region during supply of the program current.

The fuse link may include a first region in contact with the dummy metal plug and a second region in contact with the capping dielectric, the e-fuse structure may carry program current, and during supply of the program current, a first electrical driving force caused by electro-migration at the first region of the fuse link may be different from a second electrical driving force caused by electro-migration at the second region of the fuse link.

In accordance with another embodiment, an e-fuse structure of a semiconductor device includes a fuse link of a first metal material to connect a cathode with an anode; an interlayered insulating layer covering the anode, the cathode, and the fuse link; a capping dielectric between a top surface of the fuse link and the interlayered insulating layer, the capping dielectric including an insulating material different from the interlayered insulating layer; and a dummy metal plug penetrating the interlayered insulating layer and the capping dielectric and contacting the fuse link, the dummy metal plug including a barrier metal layer between a metal layer and the fuse link, wherein the barrier metal layer includes a second metal material different from the first metal material. The first metal material may have an electrical conductivity greater than the second metal material.

The first metal material may include at least one of tungsten, aluminum, copper, or copper alloys, and the second metal material may include at least one of Ta, TaN, TaSiN, Ti, TiN, TiSiN, W, WN, or a combination thereof. The barrier metal layer may cover bottom and side surfaces of the metal layer. The barrier metal layer may be thicker on the bottom surface of the metal layer than on the side surfaces of the metal layer.

The fuse link may carry program current, and the fuse link may have a void between the anode and the dummy metal plug in a programmed state. A distance between the void and the dummy metal plug may be less than a distance between the void and the anode.

In accordance with another embodiment, an e-fuse structure of a semiconductor device includes a fuse link to connect an anode to a cathode and to be programmed based on a program current; and a dummy metal plug in contact with the fuse link, wherein the fuse link includes a first metal material, the dummy metal plug includes a second metal material different from the first metal material, and the dummy metal plug changes electrical and thermal driving forces during supply of the program current to the fuse link, and wherein the electrical and thermal driving forces are based on electro-migration and thermo-migration in the fuse link.

The dummy metal plug may include a barrier metal layer between a metal layer and the fuse link, and the barrier metal layer may include the second metal material. The first metal material may have electrical conductivity greater than the second metal material. A total driving force may have a maximum value between the anode and the dummy metal plug during supply of the program current to the fuse link, and the total driving force may be based on a sum of the electrical and thermal driving forces.

The e-fuse structure may include an interlayered insulating layer covering the anode, the cathode, and the fuse link; and a capping dielectric between a top surface of the fuse link and the interlayered insulating layer, the capping dielectric including an insulating material different from the interlayered insulating layer, wherein the fuse link includes a first region in contact with the dummy metal plug and a second region in contact with the capping dielectric.

A first electrical driving force caused by electro-migration at the first region of the fuse link may be less than a second electrical driving force caused by electro-migration at the second region of the fuse link. A temperature of the fuse link may have a maximum value at the second region during supply of the program current to the fuse link.

In accordance with another embodiment, an e-fuse structure of a semiconductor device includes a fuse link of a first metal material to connect a cathode and an anode; a capping dielectric covering a top surface of the fuse link; and a dummy metal plug penetrating the capping dielectric and contacting the fuse link, wherein the fuse link is to carry program current and wherein the dummy metal plug is to change a temperature gradient in the fuse link when the fuse link carries the program current.

The dummy metal plug may include a barrier metal layer between a metal layer and the fuse link, and the barrier metal layer may include a second metal material different from the first metal material. The fuse link may include a first region in contact with the dummy metal plug and a second region in contact with the capping dielectric, and a temperature of the fuse link may have a maximum value at the second region when the fuse link carries the program current. The fuse link may have a void between the anode and the dummy metal plug in a programmed state. A distance between the void and the dummy metal plug may be less than a distance between the void and the anode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
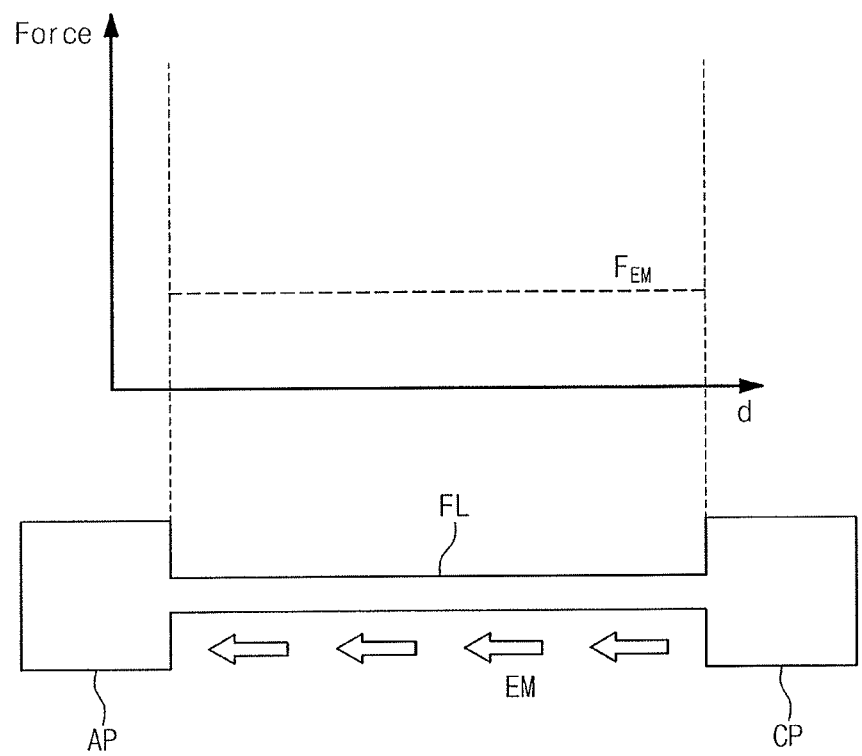
FIG. 1 illustrates an electro-migration effect in a programming process of one embodiment of an e-fuse structure.

Example embodiments art described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Also, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Also, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
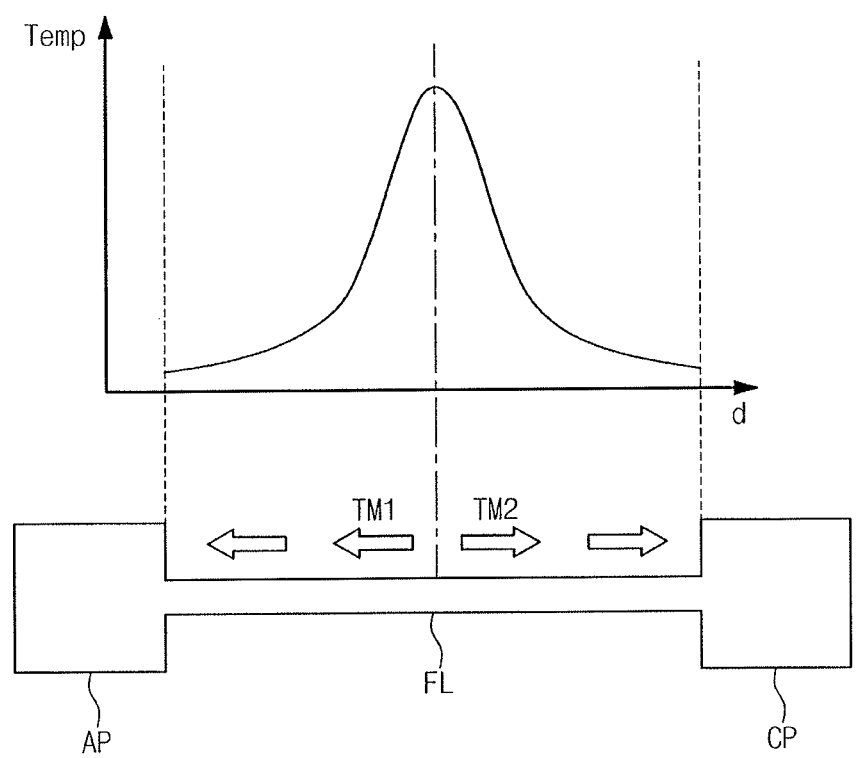
FIG. 2 illustrates thermo-migration in a programming process of one embodiment of an e-fuse structure.

FIG. 1 illustrates an electro-migration effect in a programming process of one embodiment of an e-fuse structure. FIG. 2 illustrates a diagram illustrating a thermo-migration effect in the programming process of one embodiment of an e-fuse structure.

Referring to FIGS. 1 and 2, an e-fuse structure includes a fuse link FL connecting a cathode CP with an anode AP. A process of programming this e-fuse structure may include forming a voltage difference between the cathode CP and the anode AP, in order to provide a program current to the fuse link FL.

For example, during the programming process of the e-fuse structure, a negative voltage may be applied to the cathode CP, and a positive voltage may be applied to the anode AP. Accordingly, electrons flow from the cathode CP toward the anode AP through the fuse link FL. As electrons flow through the fuse link FL, the electrons may collide with atoms of the fuse link FL, leading to a phenomenon referred to as electro migration EM. As shown in FIG. 1, a driving force (e.g., electric driving force, $F_{EM}$) caused by electro migration may be wholly constant regardless of position in the fuse link FL.

When program current is supplied to a fuse link FL formed of a metallic material (e.g., tungsten, aluminum, and copper), the temperature of the fuse link FL may increase by Joule heating. As shown in FIG. 2, the Joule heating may produce a non-uniform temperature distribution of the fuse link FL. For example, the temperature of the fuse link FL may be highest at a central portion. This non-uniform temperature distribution may cause thermo migration in the fuse link FL. For example, atoms of the fuse link FL may migrate from the central portion toward the anode AP (hereinafter, referred to as a first thermo-migration TM1) or toward the cathode CP (hereinafter, referred to as a second thermo-migration TM2).

Figure 3:
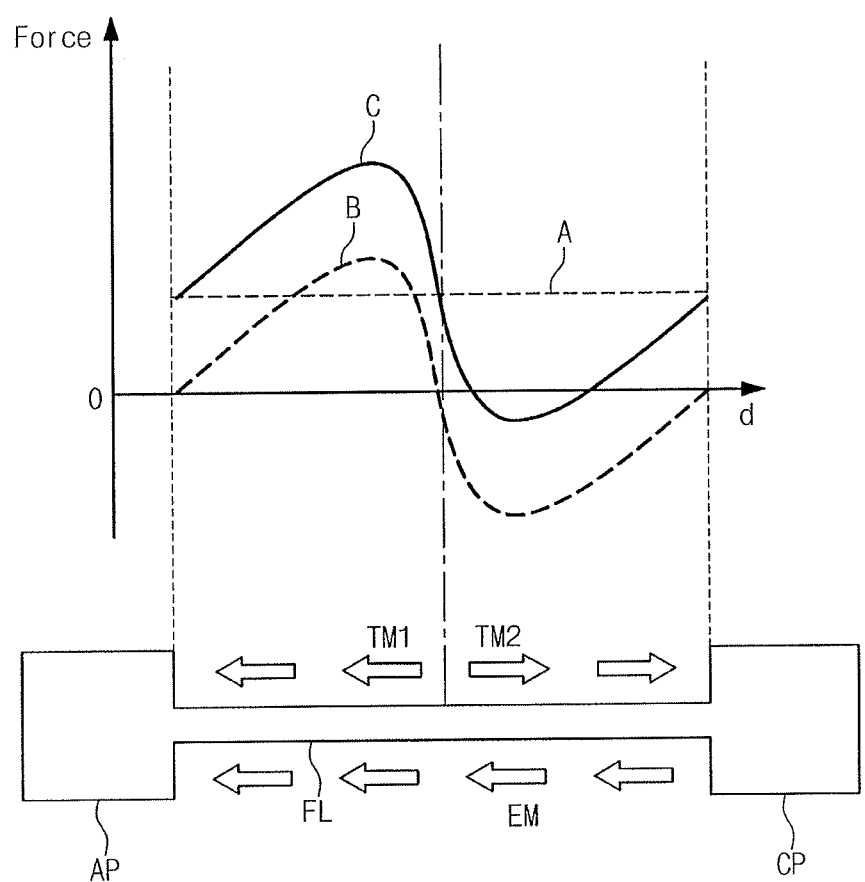
FIG. 3 illustrates thermo- and electro-migration in a programming process of an embodiment of an e-fuse structure.

FIG. 3 illustrates thermo- and electro-migration effects in a programming process of an embodiment of an e-fuse structure. In FIG. 3, curve A represents an example of a driving force caused by electro migration, which may occur when the e-fuse structure is programmed. Curve B represents a driving force caused by thermo migration which may occur when the e-fuse structure is programmed. Curve C presents a total driving force or a resulting force of two driving forces caused by thermo and electro migration.

Referring to FIG. 3, the driving force (e.g., the electric driving force $F_{EM}$) caused by electro migration may be constant regardless of portion in the fuse link FL. In contrast, driving forces (e.g., thermal driving forces $F_{TM}$) caused by non-uniform temperature distribution may be exerted from the central portion of the fuse link FL in opposite directions.

Between the anode AP and the central portion of the fuse link FL, electro-migration EM and the first thermo-migration TM1 may occur in the same direction. As a result, the total driving force, $F_{EM+TM}$, exerted on the fuse link FL may be based on the sum of the electric and thermal driving forces. In contrast, electro-migration EM and the second thermo-migration TM2 may occur in opposite directions between the cathode CP and the central portion of the fuse link FL. As a result, the total driving force, $F_{EM+TM}$, exerted on the fuse link FL may be based on a difference between the thermal driving force and the electric driving force.

In the fuse link FL, the thermal and electric driving forces may therefore result in non-uniform atomic flow rates or non-vanishing flux divergence, as shown in FIG. 3. Further, depletion or accumulation of atoms may occur depending on the magnitude of flux divergence. For example, if the out-flowing flux is greater than the in-flowing flux at a specific region of the fuse link FL, the atoms may be depleted to form a void. In contrast, if the in-flowing flux is greater than the out-flowing flux at a specific region of the fuse link FL, the atoms may be accumulated to establish a hillock formation. The void may increase electrical resistance of the fuse link FL, to thereby program the e-fuse structure.

According to the above method, the greater the flux divergence in the fuse link FL, the quicker the void is formed. Hereinafter, various structures and methods for increasing the flux divergence in the fuse link FL will be described.

Figure 4A:
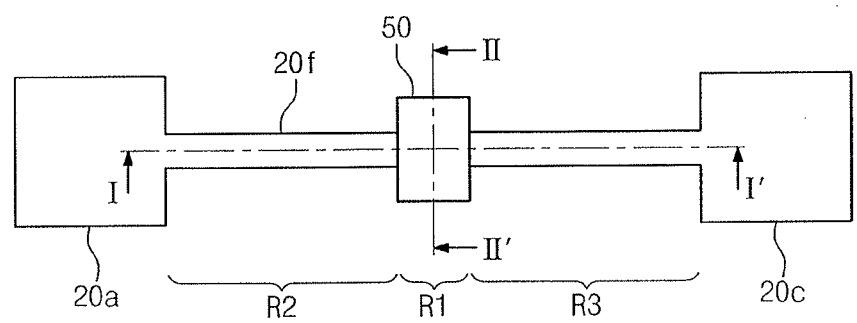
FIG. 4A illustrates first embodiment of an e-fuse structure.
Figure 4B:
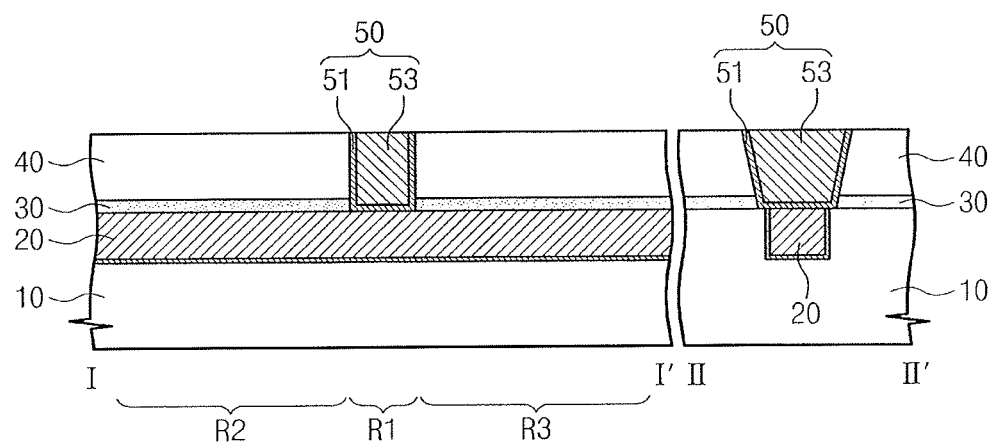
FIG. 4B illustrates a view along section lines I-I' and II-II' in FIG. 4A.

FIG. 4A illustrates a first embodiment of an e-fuse structure, and FIG. 4B illustrates a view taken along lines section lines I-I' and II-II' in FIG. 4A. Referring to FIGS. 4A and 4B, the first embodiment of the e-fuse structure includes a metal layer 20 on an underlying layer 10, a capping dielectric 30 covering a top surface of the metal layer 20, and an interlayered insulating layer 40 on the capping dielectric 30. The metal layer 20 may form a cathode 20c, an anode 20a, and a fuse link 20f connecting the cathode 20c and the anode 20a. Additionally, the e-fuse structure may include a dummy metal plug 50 in contact with a portion of the fuse link 20f.

The underlying layer 10 may be an insulating thin film. For example, the underlying layer 10 may be one of a device isolation layer, which may be formed on a semiconductor substrate to define active regions, or an interlayered insulating layer 40, which is formed on transistors to support metal lines.

The metal layer 20 may be a thin film. In one embodiment, the metal layer 20 may be formed of a first metal material. For example, the metal layer 20 may be made of at least one of tungsten (W), aluminum (Al), copper (Cu), or copper alloys. Examples of the copper alloys include copper-based materials in which at least one of C, Ag, Co, Ta, In, Sn, Zn, Mn, Ti, Mg, Cr, Ge, Sr, Pt, Mg, Al, or Zr is contained in a small or predetermined amount.

The anode 20a, the cathode 20c, and the fuse link 20f may be formed by depositing the metal layer 20 on the underlying layer 10 and patterning the metal layer 20. Alternatively, the anode 20a, the cathode 20c, and the fuse link 20f may be formed by a damascene process, which includes forming a trench in an insulating layer and filling the trench with a metallic material. In one embodiment, the fuse link 20f may extend along a specific direction, the anode 20a may be connected to an end portion of the fuse link 20f, and the cathode 20c may be connected to an opposite end portion of the fuse link 20f. The anode 20a and the cathode 20c may have widths greater than that of the fuse link 20f. As shown in the drawings, the anode 20a and the cathode 20c may be symmetrically formed. However, the anode 20a and the cathode 20c may be asymmetrically formed in an alternative embodiment.

In one embodiment, the fuse link 20f may include a first region R1, a second region R2, and a third region R3. In the first region R1, the dummy metal plug 50 and the fuse link 20f contact each other. In the second region R2, the capping dielectric 30 and the fuse link 20f contact each other between the anode 20a and the dummy metal plug 50. In the third region R3, the capping dielectric 30 and the fuse link 20f contact each other between the cathode 20c and the dummy metal plug 50.

The capping dielectric 30 may be between the interlayered insulating layer 40 and the top surface of the fuse link 20f. The capping dielectric 30 may be formed of an insulating material that is different from the underlying layer 10 and the interlayered insulating layer 40. The capping dielectric layer 30 may also conformally cover the top surface of the fuse link 20f, e.g., with a uniform thickness, but this is not necessary in all embodiments. The capping dielectric 30 may be formed, for example, of $SiO_2$, SiON, $Si_3N_4$, SiCN, SiC, or SiCN. The interlayered insulating layer 40 may be formed of silicon oxide, silicon nitride, silicon oxynitride, or a low-k material.

The dummy metal plug 50 may be formed by a process which includes forming a dummy contact hole to expose a portion of the fuse link 20f through the capping dielectric 30 and the interlayered insulating layer 40, and then filling the dummy contact hole with a metallic material. In one embodiment, the dummy metal plug 50 may be formed on the central portion of the fuse link 20f and may be in contact with the top surface of the fuse link 20f. A lower width of the dummy metal plug 50 may be greater than an upper width of the fuse link 20f, and an upper width of the dummy metal plug 50 may be greater than the lower width of the dummy metal plug 50.

In one embodiment, the dummy metal plug 50 may include a metal layer 53 and a barrier metal layer 51 interposed between the metal layer 53 and the fuse link 20f. The barrier metal layer 51 may be provided to cover bottom and side surfaces of the metal layer 53. In one embodiment, the barrier metal layer 51 may have a uniform thickness on the side and bottom surfaces of the metal layer 53. The barrier metal layer 51 may be formed of a material capable of preventing a metal material constituting the metal layer 53 from being diffused into the interlayered insulating layer 40 adjacent thereto.

In one embodiment, the barrier metal layer 51 may be formed of a second metal material, which may be different from the first metal material for the fuse link 20f and which has an electrical conductivity less than the first metal material. Examples of materials forming the barrier metal layer 51 include at least one of Ta, TaN, TaSiN, Ti, TiN, TiSiN, W, WN, or combinations thereof.

In one embodiment, the metal layer 53 may be formed of a third metal material, which may be different from the second metal material for the barrier metal layer 51. The third metal material for the metal layer 53 may be the same as or different from the first metal material for the fuse link 20f. For example, the metal layer 53 may be made of at least one of tungsten (W), aluminum (Al), copper (Cu), or copper alloys. Examples of the copper alloys include copper-based materials in which at least one of C, Ag, Co, Ta, In, Sn, Zn, Mn, Ti, Mg, Cr, Ge, Sr, Pt, Mg, Al, or Zr is contained in a small or predetermined amount.

Figure 5:
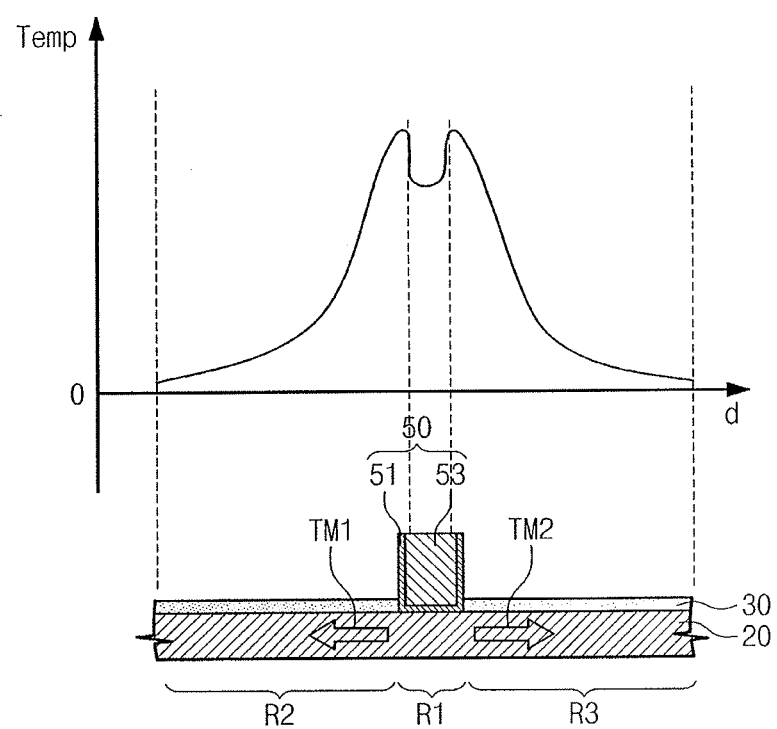
FIG. 5 illustrates electro-migration in a programming process of the first embodiment of the e-fuse structure.
Figure 6:
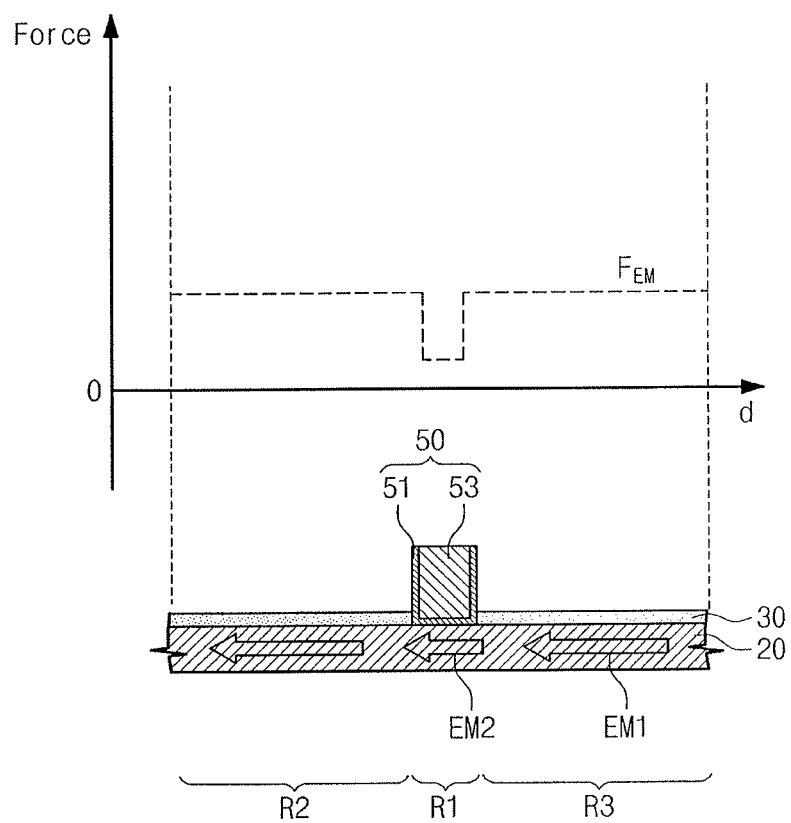
FIG. 6 illustrates thermo-migration in a programming process of the first embodiment of the e-fuse structure.
Figure 7:
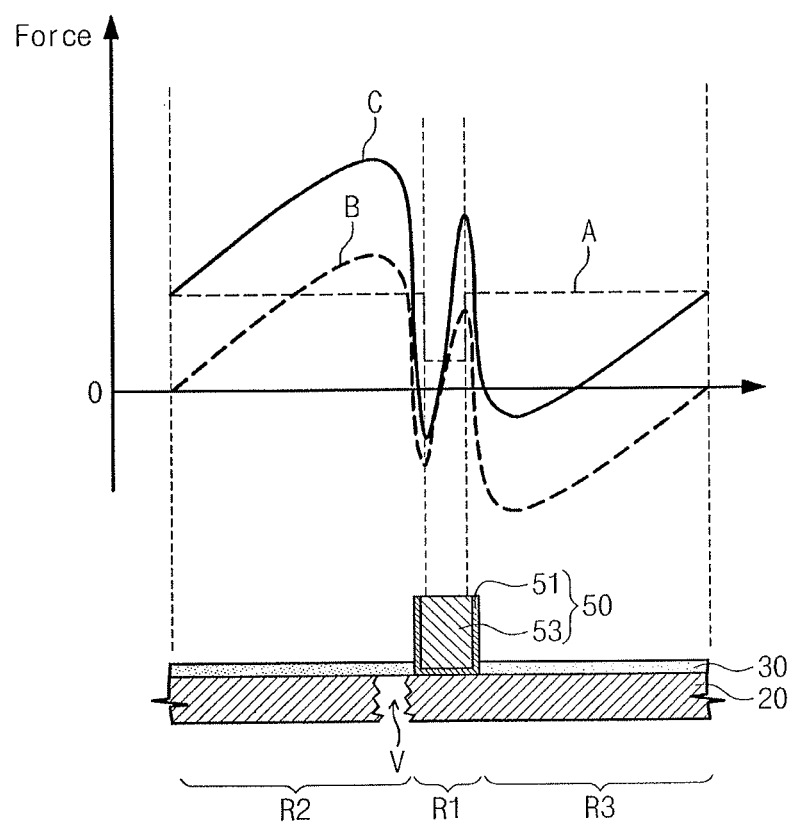
FIG. 7 illustrates thermo- and electro-migration in a programming process of the first embodiment of the e-fuse structure.

FIG. 5 illustrates electro-migration that may occur in a programming process of the first embodiment of the e-fuse structure. FIG. 6 illustrates thermo-migration that may occur in the programming process of the first embodiment of the e-fuse structure. FIG. 7 illustrates thermo- and electro-migration that may occur in the programming process of the first embodiment of the e-fuse structure.

Referring to FIG. 5, the programming process of the e-fuse structure may be performed using a program current. The program current may be produced by forming a voltage difference between the cathode 20c and the anode 20a. In one embodiment, during the programming process, a negative voltage may be applied to the cathode 20c, a positive voltage may be applied to the anode 20a, and the dummy metal plug 50 may be in an electrically floating state. The voltage difference between the cathode 20c and the anode 20a produces a program current, which causes electrons to flow from the cathode 20c toward the anode 20a through the fuse link 20f.

During this electron flow, the electrons may collide with atoms constituting the fuse link 20f, thereby causing electro-migration. The electro-migration may mainly occur along a surface of a metal layer. A driving force caused by the electro-migration may change depending on a material in contact with the fuse link 20f. In other words, as described above, the fuse link 20f may include the first region R1 where the dummy metal plug 50 and the fuse link 20f contact each other, the second region R2 where the capping dielectric 30 and the fuse link 20f contact each other between the anode 20a and the dummy metal plug 50, and the third region R3 where the capping dielectric 30 and the fuse link 20f contact each other between the cathode 20c and the dummy metal plug 50.

The driving force caused by electro-migration may differ between the first and second regions R1 and R2 and between the first and third regions R1 and R3. For example, a first electric driving force EM1 on the second and third regions R2 and R3, where metal and dielectric layers contact each other, may be less than a second electric driving force EM2 on the first region R1 where different metallic materials contact each other.

Referring to FIG. 6, Joule heat may occur when the e-fuse structure is programmed. The Joule heat may produce a non-vanishing gradient of the temperature of the fuse link 20f. In one embodiment, the greatest amount of Joule heat may be produced at the central portion of the fuse link 20f. The temperature of the first region R1, however, may decrease because a sizable fraction of such heat may be exhausted through a portion where the dummy metal plug 50 and the fuse link 20f contact each other. For example, the physical contact between the dummy metal plug 50 and the fuse link 20f may lead to a change of the temperature gradient of the fuse link 20f. For example, during programming, the temperature of the fuse link 20f may be the maximum at two separate portions as a result of the presence of the dummy metal plug 50. For example, the temperature of the fuse link 20f may be maximum values in the second and third regions R2 and R3, which are located on respective sides of the dummy metal plug 50.

In FIG. 7, a curve A shows a driving force caused by electro migration which may occur when the e-fuse structure is programmed. Curve B shows a driving force caused by thermo migration which may occur when the e-fuse structure is programmed. Curve C shows a total driving force, or a resulting force of two driving forces, caused by thermo and electro migration.

In one embodiment, because of the presence of the dummy metal plug 50, the temperature of the fuse link 20f may be the maximum at two separate portions. As a result, a portion of the fuse link 20f below the dummy metal plug 50 may have a temperature lower than other portions of the fuse link 20f. Further, due to the presence of the dummy metal plug 50, the electric driving force in a portion of the fuse link 20f below the dummy metal plug 50 may decrease.

The total driving force may change steeply in or near the first region R1 of the fuse link 20f. For example, a change rate of the total driving force $F_{EM+TM}$ may be greater in the e-fuse structure with the dummy metal plug 50 than in the e-fuse structure described with reference to FIG. 3. For example, because the flux divergence is increased at the first region R1 in contact with the dummy metal plug 50, the e-fuse structure may be more quickly programmed under the same condition, e.g., under the same voltage. This makes it possible to program the e-fuse structure at a reduced program voltage.

As shown in FIG. 7, the total driving force $F_{EM+TM}$ may be have maximum values at a portion of the fuse link 20f adjacent to the anode 20a and at a side of the dummy metal plug 50. Because the out-flowing flux is abruptly increased, a depletion or a void may occur at the second region R2 of the fuse link 20f adjacent to the dummy metal plug 50. Thus, after the programming process, the e-fuse structure may have a void V between the anode 20a and the dummy metal plug 50. A distance between the void V and the dummy metal plug 50 may be less than a distance between the void V and the anode 20a.

Figure 8A:
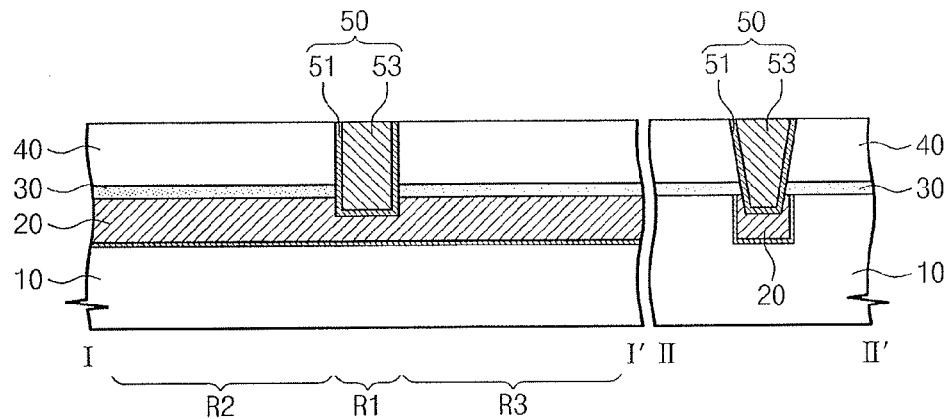
FIGS. 8A through 8C illustrate sectional views modifications of the first embodiment of the e-fuse structure.
Figure 8B:
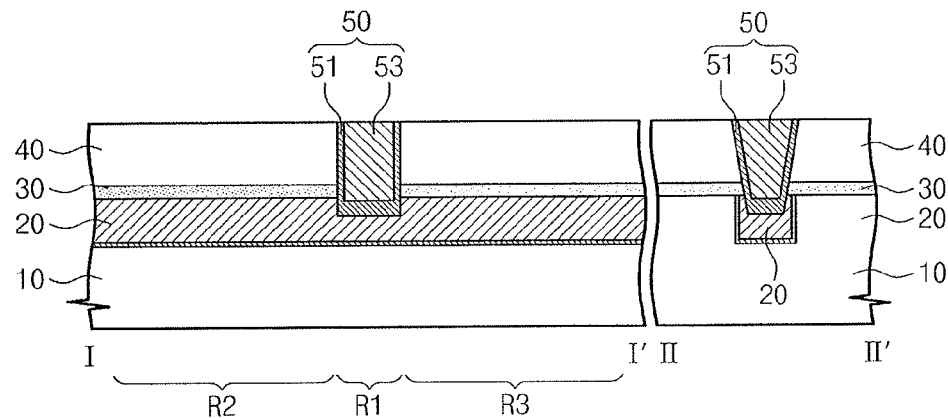
Figure 8C:
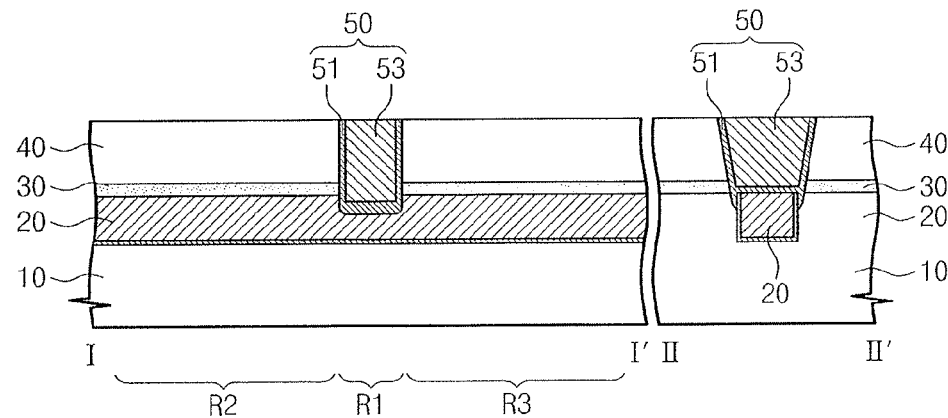

FIGS. 8A through 8C illustrate modifications of the first embodiment of the e-fuse structure. Referring to FIGS. 8A through 8C, as described with reference to FIG. 4B, the e-fuse structure includes the cathode 20c, the anode 20a, the fuse link 20f, and the dummy metal plug 50. The fuse link 20f includes the first region R1 where the dummy metal plug 50 and the fuse link 20f contact each other, the second region R2 where the capping dielectric 30 and the fuse link 20f contact each other between the anode 20a and the dummy metal plug 50, and the third region R3 where the capping dielectric 30 and the fuse link 20f contact each other between the cathode 20c and the dummy metal plug 50.

Referring to FIGS. 8A through 8C, the dummy metal plug 50 may include the barrier metal layer 51 and the metal layer 53 as described above, and may have a bottom surface that is lower than the top surface of the fuse link 20f. The bottom surface of the dummy metal plug 50 may be spaced from the top surface of the underlying layer 10. In other words, a thickness of the fuse link 20f may be smaller on the first region R1 than on the second and third regions R2 and R3. Further, as shown in FIGS. 8A and 8B, the dummy metal plug 50 may have a lower width less than the upper width of the fuse link 20f. In one embodiment, as shown in FIG. 8B, the thickness of the barrier metal layer 51 may be greater on the bottom surface of the metal layer 53 than on the side surface of the metal layer 53.

In one embodiment as shown in FIG. 8C, the dummy metal plug 50 may have a round lower corner. Also, the lower width of the dummy metal plug 50 may be greater than the upper width of the fuse link 20f. Thus, the dummy metal plug 50 may cover the top surface and a portion of the side surface of the fuse link 20f. In other words, the barrier metal layer 51 may be in direct contact with the top and side surfaces of the fuse link 20f.

Figure 9A:
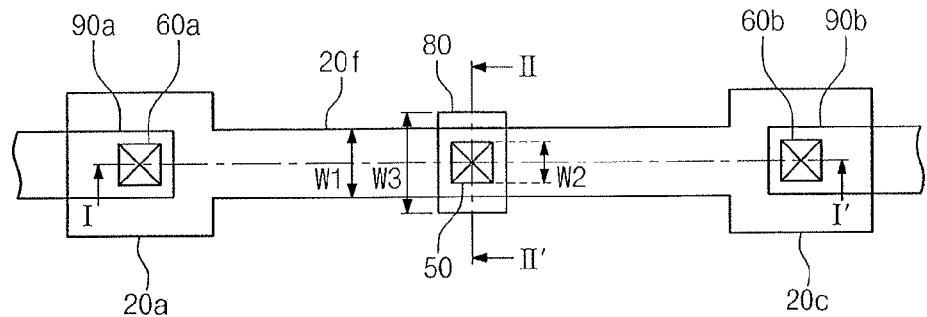
FIGS. 9A and 10A illustrate a second embodiment of an e-fuse structure.
Figure 9B:
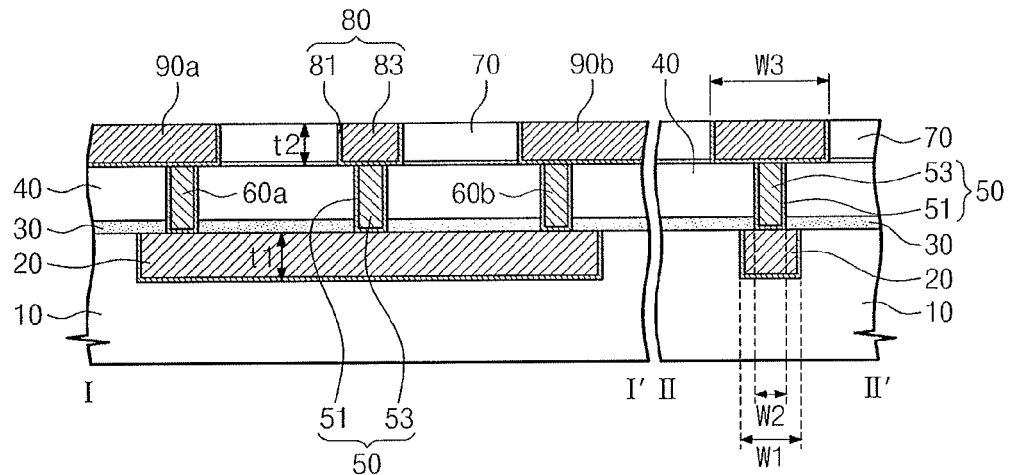
FIGS. 9B and 10B illustrate views along lines section lines I-I' and II-II' in FIGS. 9A and 10A, respectively.
Figure 9C:
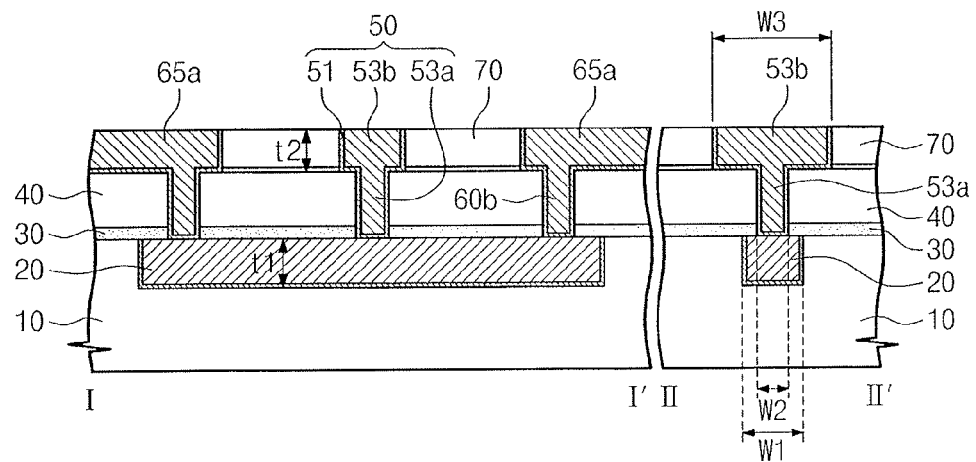
FIGS. 9C and 10C illustrate modifications of the second embodiment of the e-fuse structure.
Figure 10A:
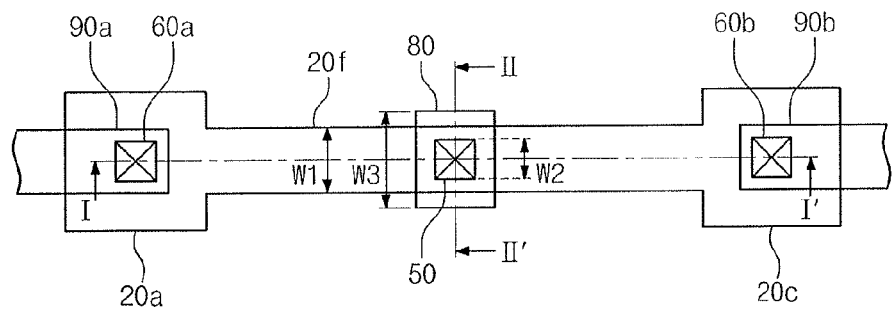
Figure 10B:
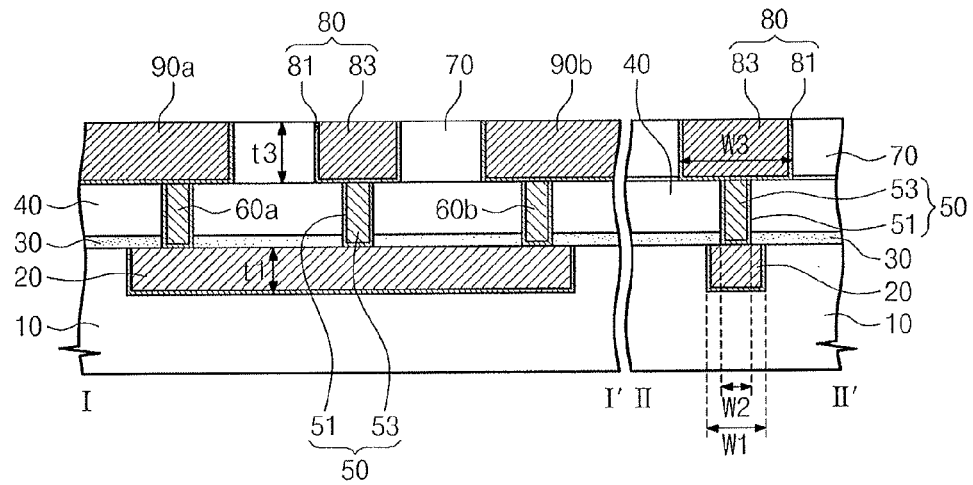
Figure 10C:
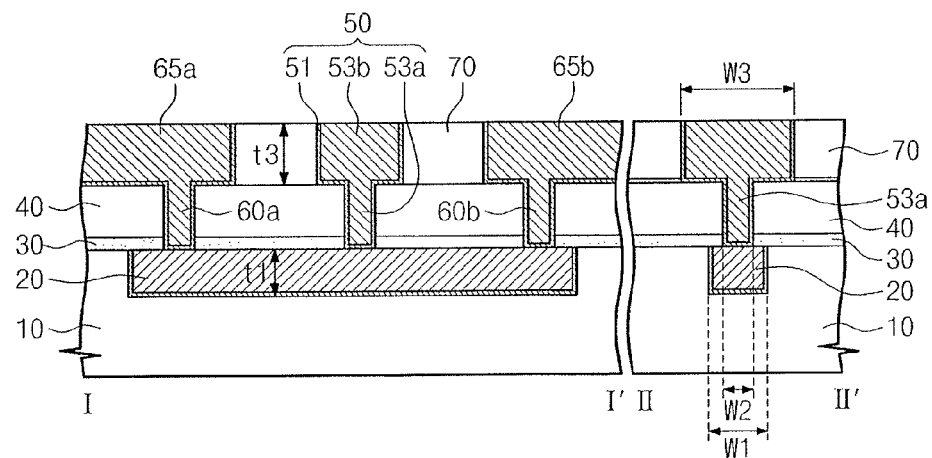

FIGS. 9A and 10A illustrate a second embodiment of an e-fuse structures, FIGS. 9B and 10B illustrate views taken along section lines I-I' and in FIGS. 9A and 10A, respectively, and FIGS. 9C and 10C illustrate modifications of the second embodiment of the e-fuse structure.

In the second embodiment, the e-fuse structure includes at least one layer of the dummy metal plug 50 and a dummy metal pattern 80 connected to the fuse link 20f. A volume of the dummy metal pattern 80 may be adjusted to control fusing performance of the e-fuse structure.

Referring to FIGS. 9A, 9B, 10A, and 10B, the second embodiment of the e-fuse structure includes the metal layer 20 on an underlying layer 10, the capping dielectric 30 covering the top surface of the metal layer 20, and the interlayered insulating layer 40 on the capping dielectric 30. The metal layer 20 may form the cathode 20c, the anode 20a, and the fuse link 20f connecting the cathode 20c with the anode 20a. In addition, the e-fuse structure may include the dummy metal plug 50 and the dummy metal pattern 80 connected to a portion of the fuse link 20f. A first contact plug 60a and a first conductive pattern 90a may be connected to the anode 20a. A second contact plug 60b and a second conductive pattern 90b may be connected to the cathode 20c.

In one embodiment, the fuse link 20f may extend along a specific direction, the anode 20a may be connected to an end portion of the fuse link 20f, and the cathode 20c may be connected to an opposite end portion of the fuse link 20f. The anode 20a and the cathode 20c may have a width greater than the fuse link 20f. In one embodiment, the metal layer 20 may be formed of a first metal material. For example, the metal layer 20 may be made of at least one of tungsten (W), aluminum (Al), copper (Cu), or copper alloys. Examples of the copper alloys include copper-based materials, in which at least one of C, Ag, Co, Ta, In, Sn, Zn, Mn, Ti, Mg, Cr, Ge, Sr, Pt, Mg, Al, or Zr is contained in a small or predetermined amount.

The capping dielectric 30 and a first interlayered insulating layer 40 may be sequentially formed on the underlying layer 10, on which the anode 20a, the cathode 20c, and the fuse link 20f are provided. The capping dielectric 30 may be formed of an insulating material different from the underlying layer 10 and the first interlayered insulating layer 40. The capping dielectric may conformally cover the top surface of the fuse link 20f, and may be formed, for example, of $SiO_2$, SiON, $Si_3N_4$, SiCN, SiC, or SiCN.

The formation of the dummy metal plug 50 may include forming a dummy contact hole penetrating the capping dielectric 30 and the first interlayered insulating layer 40 and exposing a portion of the fuse link 20f. Then, the dummy contact hole may be filled with a metallic material. The formation of the first contact plug 60a may include forming a first contact hole penetrating the capping dielectric 30 and the first interlayered insulating layer 40 and exposing a portion of the anode 20a, and then filling the first contact hole with a metallic material.

The formation of the second contact plug 60b may include forming a second contact hole penetrating the capping dielectric 30 and the first interlayered insulating layer 40 and exposing a portion of the cathode 20c, and then filling the second contact hole with a metallic material. In one embodiment, the dummy metal plug 50 may be concurrently formed with the first and second contact plugs 60a and 60b. Further, the dummy metal plug 50 may include the same metallic material as at least one of the first and second contact plugs 60a and 60b.

In one embodiment, each of the dummy metal plug 50 and the first and second metal contact plugs 60a and 60b may include a first barrier metal layer 51 and a first metal layer 53. The first barrier metal layer 51 may be formed to have a uniform thickness on side and bottom surfaces of the dummy contact hole. In one embodiment, the first barrier metal layer 51 may be formed of a second metal material, which may be different from the first metal material for the fuse link 20f, and The first barrier metal layer 51 may have an electrical conductivity less than the first metal material. For example, the first barrier metal layer 51 may be formed of Ta, TaN, TaSiN, Ti, TiN, TiSiN, W, WN, or combinations thereof.

The first metal layer 53 may be formed of a third metal material, which may be different from the second metal material for the first barrier metal layer 51. The third metal material for the first metal layer 53 may be the same as or different from the first metal material for the fuse link 20f. For example, the first metal layer 53 may be made of at least one of tungsten (W), aluminum (Al), copper (Cu), or copper alloys. Examples of the copper alloys include copper-based materials, in which at least one of C, Ag, Co, Ta, In, Sn, Zn, Mn, Ti, Mg, Cr, Ge, Sr, Pt, Mg, Al, or Zr is contained in a small or predetermined amount.

A second interlayered insulating layer 70 may be formed on the first interlayered insulating layer 40 provided with the dummy metal plug 50 and the first and second contact plugs 60a and 60b. The first and second conductive patterns 90a and 90b and the dummy metal pattern 80 may be formed in the second interlayered insulating layer 70. The dummy metal pattern 80 may be connected to the dummy metal plug 50. The first and second conductive patterns 90a and 90b may be connected to the first and second contact plugs 60a and 60b, respectively.

The dummy metal pattern 80 may include a second metal layer 83, and a second barrier metal layer 81 interposed between the second metal layer 83 and the dummy metal plug 50. The formation of the dummy metal pattern 80 may include forming a trench in the second interlayered insulating layer 70 to expose the top surface of the dummy metal plug 50, and then sequentially forming the second barrier metal layer 81 and the second metal layer 83 to fill the trench. The second barrier metal layer 81 may be formed, for example, of Ta, TaN, TaSiN, Ti, TiN, TiSiN, W, WN, or combinations thereof.

The second metal layer 83 may be formed of a metal material different from that of the first metal layer 51 constituting the dummy metal plug 50. The first and second conductive patterns 90a and 90b may be concurrently formed with the dummy metal pattern 80. For example, the first and second conductive patterns 90a and 90b may be formed of the same metal material as the dummy metal pattern 80.

According to the embodiments in FIGS. 9A and 9B, a width W2 of the dummy metal plug 50 may be less than a width W1 of the fuse link 20f. A width W3 of the dummy metal pattern 80 may be greater than the width W1 of the fuse link 20f. In addition, the dummy metal pattern 80 may have a first thickness t2 less than a thickness t1 of the fuse link 20f.

According to the embodiments in FIGS. 10A and 10B, the width W2 of the dummy metal plug 50 may be less than the width W1 of the fuse link 20f. The width W3 of the dummy metal pattern 80 may be greater than the width W1 of the fuse link 20f. In addition, the dummy metal pattern 80 may have a second thickness t3 greater than the thickness t1 of the fuse link 20f.

According to the second embodiment, the dummy metal pattern 80 in FIGS. 9A and 9B may have a volume different from that of the dummy metal pattern 80 in FIGS. 10A and 10B. For example, the volume of the dummy metal pattern 80 in FIGS. 9A and 9B may be less than that of the dummy metal pattern 80 in FIGS. 10A and 10B.

According to the embodiments in FIG. 9C and FIG. 10C, the e-fuse structure may include the metal layer 20 on the underlying layer 10, the capping dielectric 30 covering the top surface of the metal layer 20, and first and second interlayered insulating layers 40 and 70 on the capping dielectric 30. The metal layer 20 may form the cathode 20c, the anode 20a, and the fuse link 20f connecting the cathode 20c and the anode 20a. In one embodiment, the anode 20a and the cathode 20c may have widths greater than the fuse link 20f. The metal layer 20 may be formed, for example, of a first metal material, e.g., at least one of tungsten (W), aluminum (Al), copper (Cu), or copper alloys. Examples of the copper alloys include copper-based materials, in which at least one of C, Ag, Co, Ta, In, Sn, Zn, Mn, Ti, Mg, Cr, Ge, Sr, Pt, Mg, Al, or Zr is contained in a small or predetermined amount.

According to this embodiment, the e-fuse structure may include the dummy metal plug 50 in contact with a portion of the dummy fuse link 20f. The dummy metal plug 50 may include the barrier metal layer 51, a contact portion 53a, and an interconnection portion 53b. The barrier metal layer 51 may be formed of a conductive material capable of preventing a metal material constituting the contact portion 53a and the interconnection portion 53b from being diffused into the adjacent first and second interlayered insulating layers 40 and 70. The barrier metal layer 51 may be formed of a second metal material different from the first metal material, and having electrical conductivity less than the first metal material. For example, the barrier metal layer 51 may be formed of Ta, TaN, TaSiN, Ti, TiN, TiSiN, W, WN, or combinations thereof.

In one embodiment, the contact portion 53a may be connected to the fuse link 20f through the first interlayered insulating layer 40. The interconnection portion 53b may be disposed in the second interlayered insulating layer 70 and may be connected to the contact portion 53a. The interconnection portion 53b may have widths greater than that of the contact portion 53a. The contact portion 53a and the interconnection portion 53b may be formed of a third metal material, which may be different from the second metal material. For example, the contact portion 53a and the interconnection portion 53b may be made of tungsten (W), aluminum (Al), copper (Cu), or copper alloys. Examples of the copper alloys include copper-based materials in which at least one of C, Ag, Co, Ta, In, Sn, Zn, Mn, Ti, Mg, Cr, Ge, Sr, Pt, Mg, Al, or Zr is contained in a small or predetermined amount.

In one embodiment shown in FIG. 9C, the lower width W2 of the dummy metal plug 50 may be less than the width W1 of the fuse link 20f. The upper width W3 of the dummy metal plug 50 may be greater than the width W1 of the fuse link 20f. In addition, in the dummy metal plug 50, the interconnection portion 53b may have a first thickness t2 less than the thickness t1 of the fuse link 20f.

Alternatively, as shown in FIG. 10C, the lower width W2 of the dummy metal plug 50 may be less than the width W1 of the fuse link 20f. The upper width W3 of the dummy metal plug 50 may be greater than the width W1 of the fuse link 20f. Also, the interconnection portion 53b of the dummy metal plug 50 may have a second thickness t3 greater than the thickness t1 of the fuse link 20f. For example, a volume of the interconnection portion 53b of the dummy metal plug 50 in FIG. 9C may be less than the interconnection portion 53b of the dummy metal plug 50 in FIG. 10C.

The formation of the dummy metal plug 50 may include sequentially forming the first and second interlayered insulating layers 40 and 70, forming a via hole through the first and second interlayered insulating layers 40 and 70, patterning the second interlayered insulating layer 70 to form a trench connected to the via hole, and sequentially forming a barrier metal layer and a metal layer in the via hole and the trench. In one embodiment, first and second connection patterns 65a and 65b may be formed during formation of the dummy metal plug 50. The first connection pattern 65a may be connected to the anode 20a, and the second connection pattern 65b may be connected to the cathode 20c.

Similar to the dummy metal plug 50, each of the first and second connection patterns 65a and 65b may include a via portion, an interconnection portion, and a barrier metal layer covering bottom and side surfaces thereof.

Figure 11A:
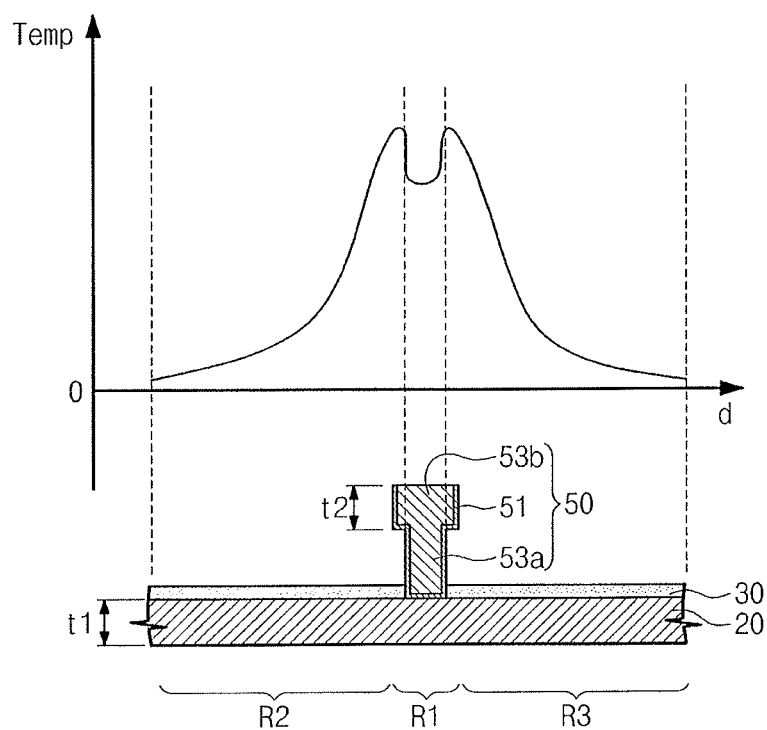
FIGS. 11A and 12A illustrate thermo-migration in a programming process of the second embodiment of the e-fuse structure.
Figure 12A:
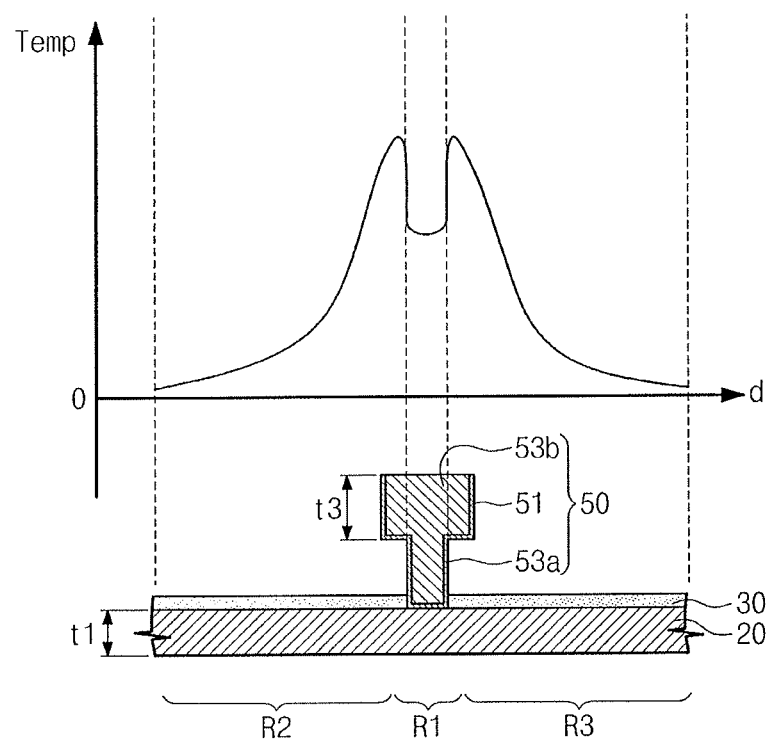

FIGS. 11A and 12A illustrate examples of how thermomigration may depend on the volume of a dummy metal pattern, in a programming process of the second embodiment of the e-fuse structure.

According to the second embodiment, during programming, a negative voltage may be applied to the cathode 20c, a positive voltage may be applied to the anode 20a, and the dummy metal plug 50 may be in an electrically floating state. Because of the voltage difference between the cathode 20c and the anode 20a and the consequent program current, electrons flow from the cathode 20c toward the anode 20a through the fuse link 20f.

According to the second embodiment, as shown in FIGS. 11A and 12A, during programming, a temperature gradient of the fuse link 20f may be controlled by adjusting the volume of the dummy metal plug 50. In FIG. 11A, the interconnection portion 53b of the dummy metal plug 50 may have a first thickness t2 less than the thickness t1 of the fuse link 20f. In FIG. 12A, the interconnection portion 53b of the dummy metal plug 50 may have a second thickness t3 greater than the thickness t1 of the fuse link 20f. For example, a volume of the interconnection portion 53b of the dummy metal plug 50 in FIG. 12A may be greater than the interconnection portion 53b of the dummy metal plug 50 shown in FIG. 11A.

As the volume of the dummy metal plug 50 increases, the first region R1 of the fuse link 20f may be more effectively cooled. For example, a temperature of the first region R1 of the fuse link 20f may be more effectively decreased compared with a neighboring region. The reduction in the temperature of the first region R1 may be greater in the e-fuse structure in FIG. 12A than in the e-fuse structure in FIG. 11A. As a result, non-uniformity in the temperature distribution of the fuse link 20f may be higher in the e-fuse structure of FIG. 12A than in the e-fuse structure of FIG. 11A.

Figure 11B:
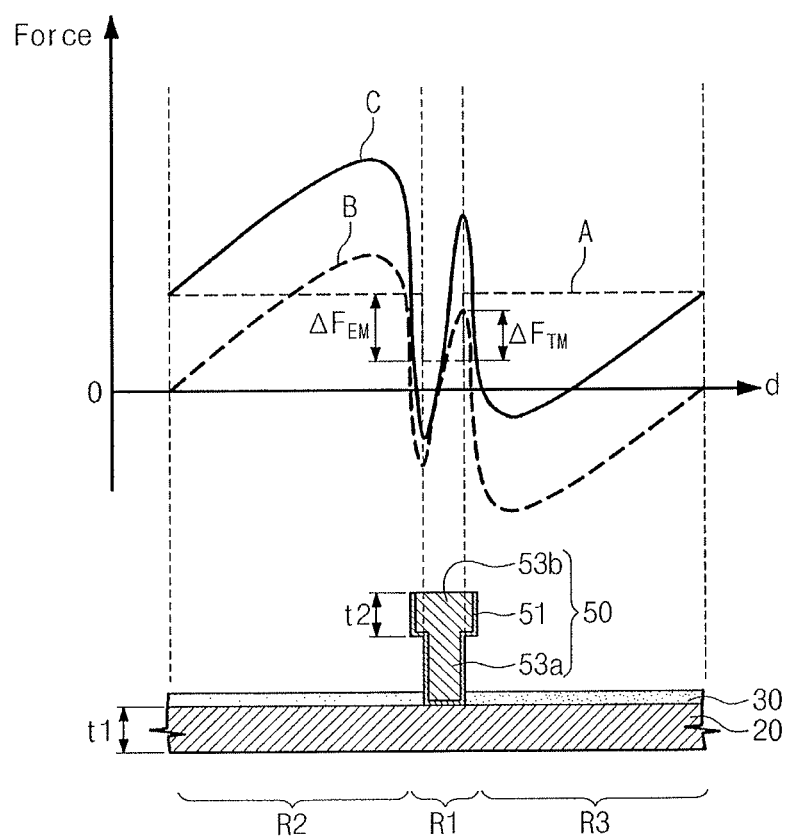
FIGS. 11B and 12B illustrate thermo- and electro-migration in a programming process of the second embodiment of the e-fuse structure.
Figure 12B:
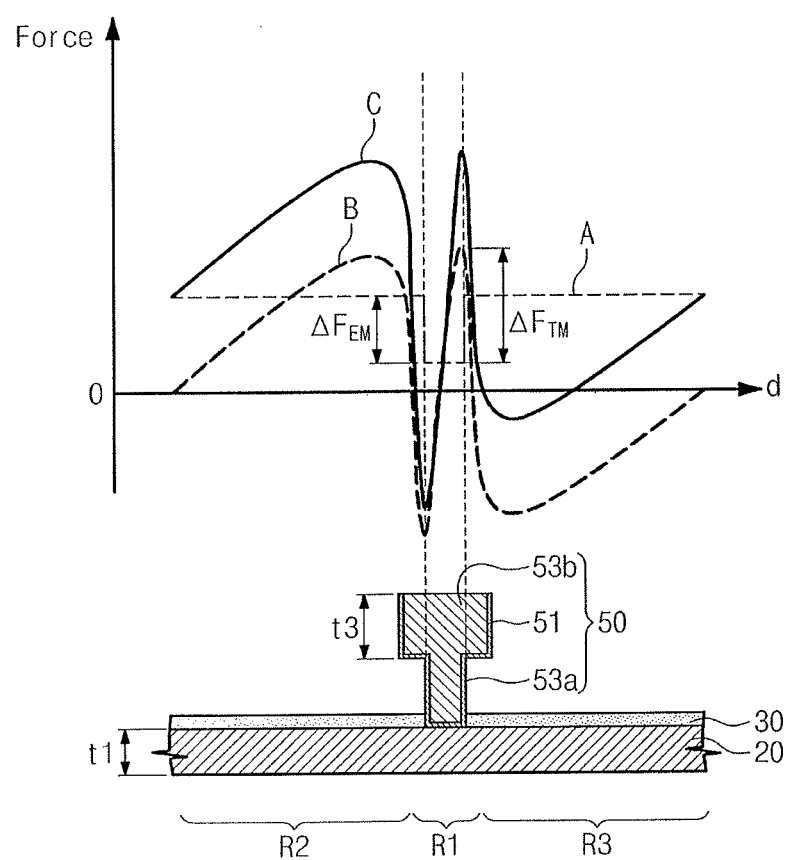

FIGS. 11B and 12B illustrate thermo- and electro-migration effects in the programming process of the second embodiment of the e-fuse structure. In FIGS. 11B and 12B, curve A represents a driving force caused by electro migration which may occur when the e-fuse structure is programmed. Curve B represents a driving force caused by thermo migration which may occur when the e-fuse structure is programmed. In FIGS. 11B and 12B, curve C represents a total driving force, or a resulting force of two driving forces, caused by the thermo and electro migration.

Referring to FIG. 11B, in the first region R1 of the fuse link 20f, a difference $\Delta F_{EM}$ of the electric driving force may be greater than a difference $\Delta F_{TM}$ of the thermal driving force. For example, the total driving force in the first region R1 of the fuse link 20f may be predominantly dependent on the difference $\Delta F_{EM}$ of the electric driving force.

Referring to FIG. 12B, in the first region R1 of the fuse link 20f, a difference $\Delta F_{TM}$ of the thermal driving force may be greater than a difference $\Delta F_{EM}$ of the electric driving force. For example, the total driving force in the first region R1 of the fuse link 20f may be predominantly dependent on the difference $\Delta F_{TM}$ of the thermal driving force.

According to the present embodiment, the stronger the thermal driving force, the stronger the total driving force in the first region R1 of the fuse link 20f. This may allow for faster programming of the e-fuse structure under the given voltage condition or a reduction of voltage required for programming the e-fuse structure.

Figure 13A:
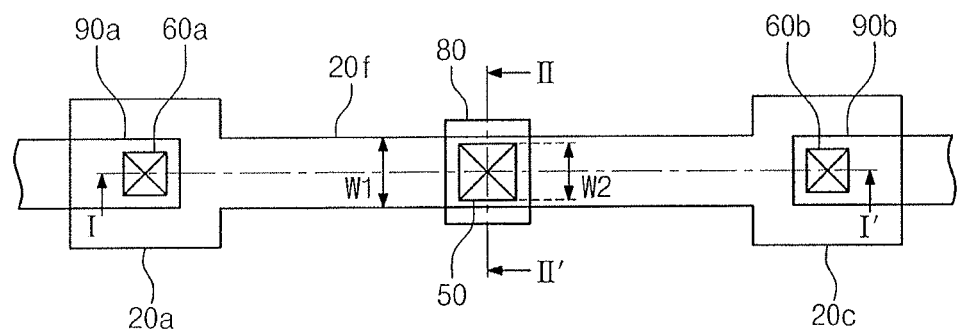
FIGS. 13A and 14A illustrate a third embodiment of an e-fuse structure.
Figure 13B:
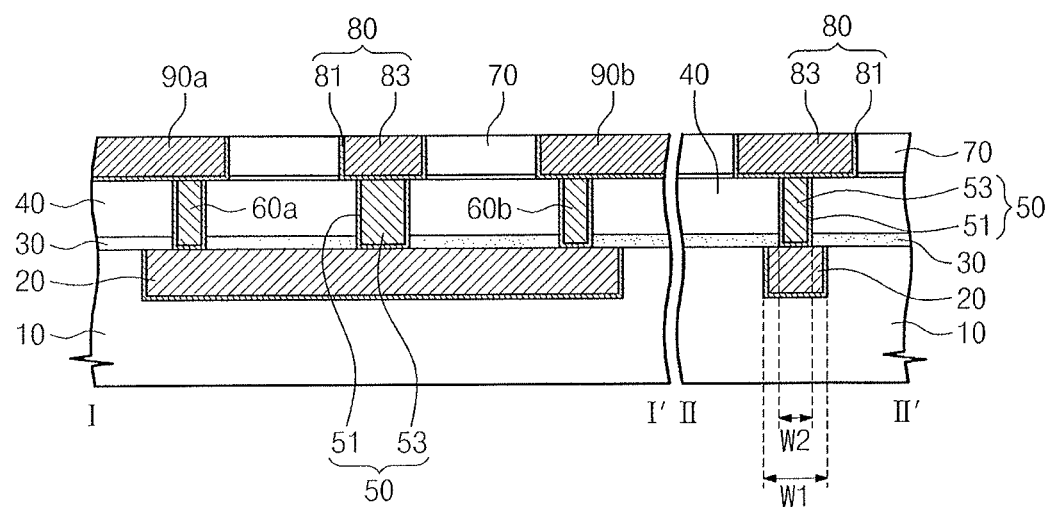
FIGS. 13B and 14B illustrate views section lines and II-II' in FIGS. 13A and 14A, respectively.
Figure 14A:
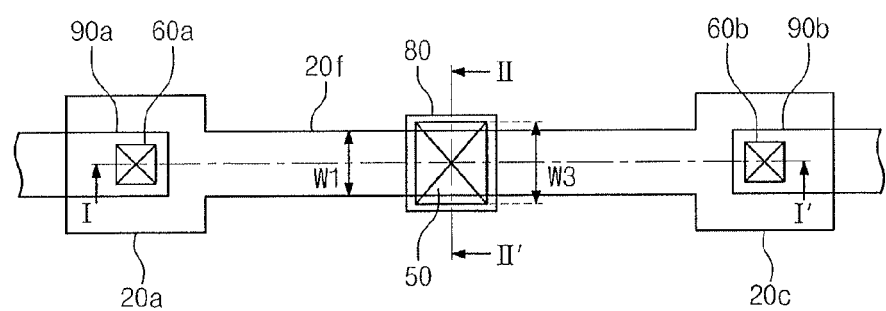
Figure 14B:
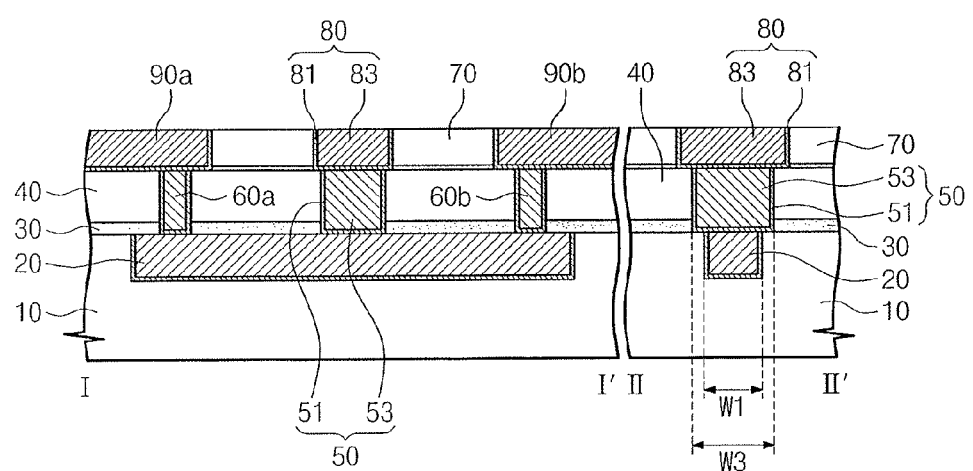

FIGS. 13A and 14A illustrate a third embodiment of an e-fuse structure, and FIGS. 13B and 14B illustrate views taken along section lines I-I' and II-II' lines FIGS. 13A and 14A, respectively.

Referring to FIGS. 13A, 13B, 14A, and 14B, the e-fuse structure includes the metal layer 20 on the underlying layer 10, the capping dielectric 30 covering the top surface of the metal layer 20, and the interlayered insulating layer 40 on the capping dielectric 30. In one embodiment, the metal layer 20 may be formed of a first metal material and may constitute the cathode 20c, the anode 20a, and the fuse link 20f connecting the cathode 20c with the anode 20a. Further, the e-fuse structure may include the dummy metal plug 50 in contact with a portion of the fuse link 20f and the dummy metal pattern 80 provided on the dummy metal plug 50. The first contact plug 60a and the first conductive pattern 90a may be connected to the anode 20a, and the second contact plug 60b and the second conductive pattern 90b may be connected to the cathode 20c.

The dummy metal plug 50 and the dummy metal pattern 80 may be concurrently formed using a damascene process, like the dummy metal plug 50 shown in FIGS. 9C and 10C. For example, the barrier metal layer 81 may not be formed between the metal layer 53 of the dummy metal plug 50 and the metal layer 83 of the dummy metal pattern 80.

According to the third embodiment, a contact area between the dummy metal plug 50 and the fuse link 20f may be changed to control the temperature gradient of the fuse link in the programming process of the e-fuse structure. For example, as shown in FIGS. 13A and 13B, the dummy metal plug 50 may have a first lower width W2 that is less than an upper width W1 of the fuse link 20f. A lower width of the dummy metal pattern 80 may be greater than the upper width W1 of the fuse link 20f. Alternatively, as shown in FIGS. 14A and 14B, the dummy metal plug 50 may have a second lower width W3 greater than the upper width W1 of the fuse link 20f. The lower width of the dummy metal pattern 80 may be greater than the upper width W1 of the fuse link 20f. According to the third embodiment, the temperature gradient of the fuse link 20f in the programming process may differ between the e-fuse structure in FIGS. 13A and 13B and the e-fuse structure in FIGS. 14A and 14B.

Figure 15A:
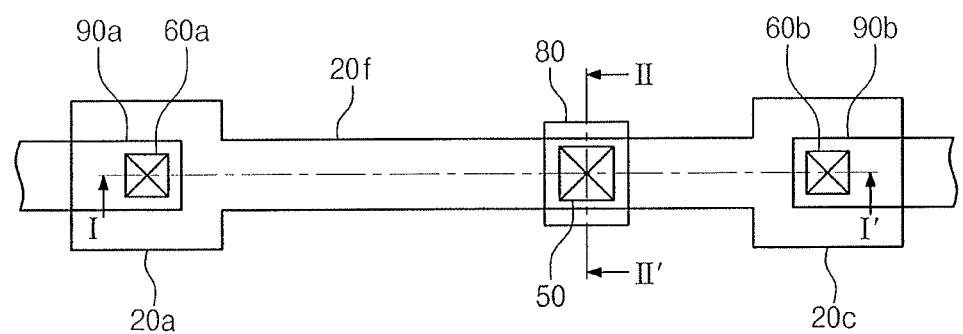
FIG. 15A illustrates a fourth embodiment of an e-fuse structure.
Figure 15B:
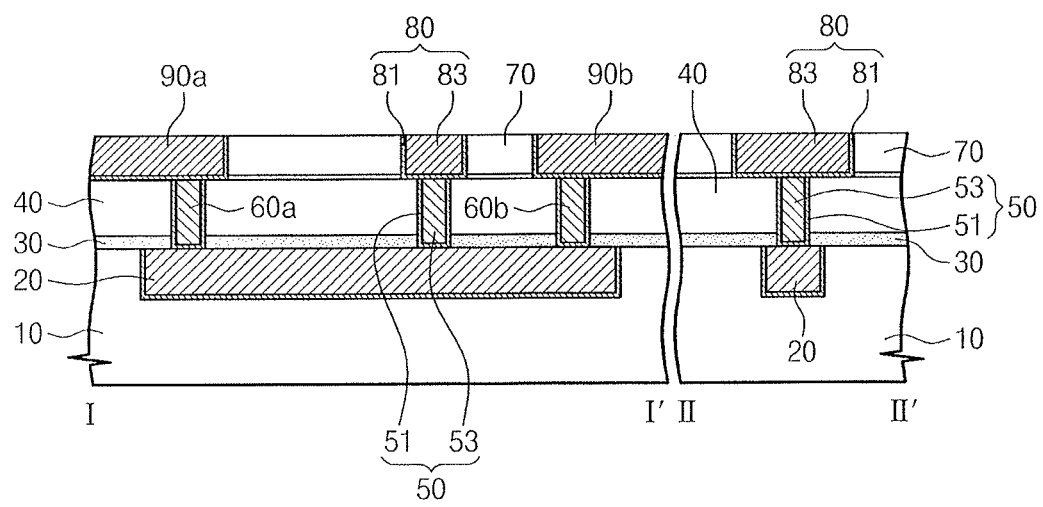
FIG. 15B illustrates a view along section lines I-I' and II-II' in FIG. 15A.

FIG. 15A illustrates a fourth embodiment of an e-fuse structure, and FIG. 15B illustrates a view taken along section lines I-I' and II-II' in FIG. 15A. Referring to FIGS. 15A and 15B, the e-fuse structure may include the metal layer 20 on the underlying layer 10, the capping dielectric 30 covering the top surface of the metal layer 20, and the interlayered insulating layer 40 on the capping dielectric 30. The metal layer 20 may be used to form the cathode 20c, the anode 20a, and the fuse link 20f connecting the cathode 20c with the anode 20a.

Further, the e-fuse structure may include the dummy metal plug 50 in contact with a portion of the fuse link 20f and the dummy metal pattern 80 on the dummy metal plug 50. The first contact plug 60a and the first conductive pattern 90a may be connected to the anode 20a. The second contact plug 60b and the second conductive pattern 90b may be connected to the cathode 20c. The dummy metal plug 50 and the dummy metal pattern 80 may be concurrently formed, like the dummy metal plug 50 in FIGS. 9C and 10C. For example, the barrier metal layer 81 may not be formed between the metal layer 53 of the dummy metal plug 50 and the metal layer 83 of the dummy metal pattern 80.

In the present embodiment, positions of the dummy metal plug 50 and the dummy metal pattern 80 may be changed relative to the anode 20a and the cathode 20c. For example, in FIG. 15A, a distance between the dummy metal plug 50 and the anode 20a may be greater than a distance between the dummy metal plug 50 and the cathode 20c. The position of the dummy metal plug 50 may be changed to control the position of a void, which will be formed in the programming process of the e-fuse structure.

Figure 16A:
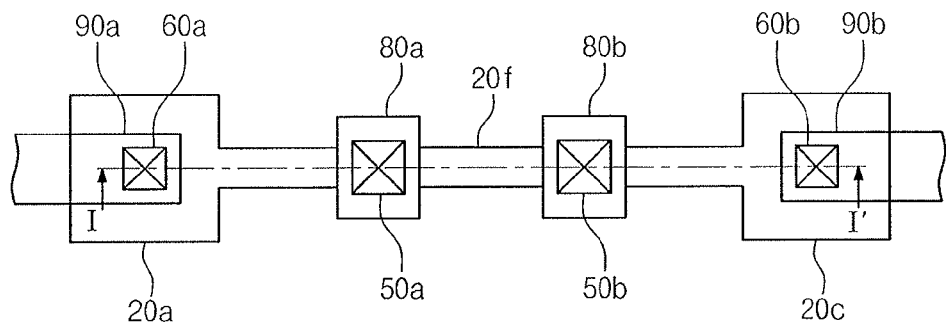
FIG. 16A illustrates a fifth embodiment of an e-fuse structure.
Figure 16B:
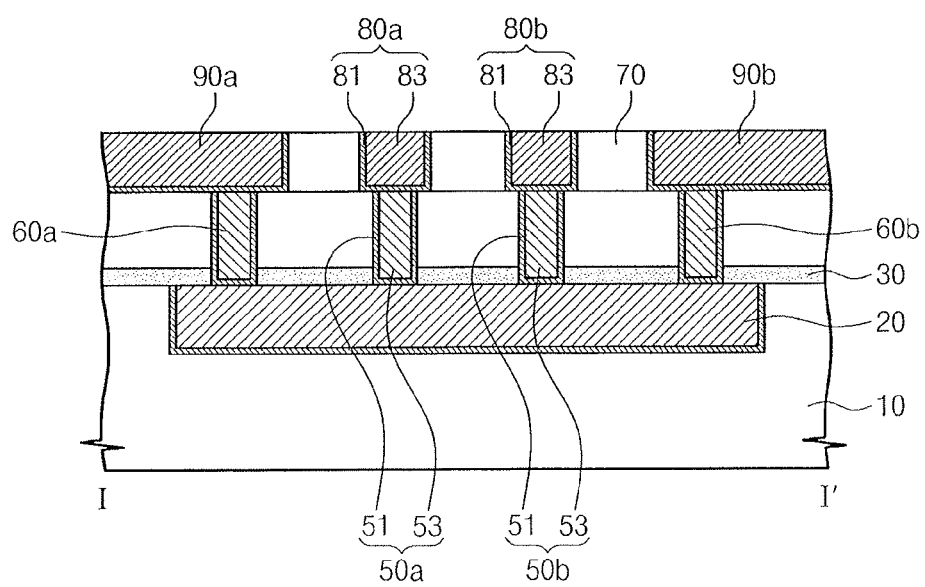
FIG. 16B illustrates a view along section lines I-I' and II-II' in FIG. 16A.

FIG. 16A illustrates a fifth embodiment of an e-fuse structure, and FIG. 16B illustrates a view taken along section lines I-I' and II-II' in FIG. 16A. Referring to FIGS. 16A and 16B, the e-fuse structure may include the metal layer 20 on the underlying layer 10, the capping dielectric 30 covering the top surface of the metal layer 20, and the interlayered insulating layer 40 on the capping dielectric 30. In one embodiment, the metal layer 20 may be formed of a first metal material and may form the cathode 20c, the anode 20a, and the fuse link 20f connecting the cathode 20c with the anode 20a.

The e-fuse structure may also include first and second dummy metal plugs 50a and 50b in contact with a portion of the fuse link 20f. First and second dummy metal patterns 80a and 80b may be provided on the first and second dummy metal plugs 50a and 50b, respectively. The first and second dummy metal plugs 50a and 50b may be between the anode 20a and the cathode 20c and spaced from each other. Each of the first and second dummy metal plugs 50a and 50b may include the barrier metal layer 51 and the metal layer 53. The barrier metal layer 51 may be formed of a second metal material different from the first metal material and having electrical conductivity less than the first metal material. The first contact plug 60a and the first conductive pattern 90a may be connected to the anode 20a. The second contact plug 60b and the second conductive pattern 90b may be connected to the cathode 20c.

In other embodiments, the first dummy metal plug 50a and the first dummy metal pattern 80a may be concurrently formed, like the dummy metal plug 50 in FIGS. 9C and 10C. Similarly, the second dummy metal plug 50b and the second dummy metal pattern 80b may be concurrently formed.

Figure 17A:
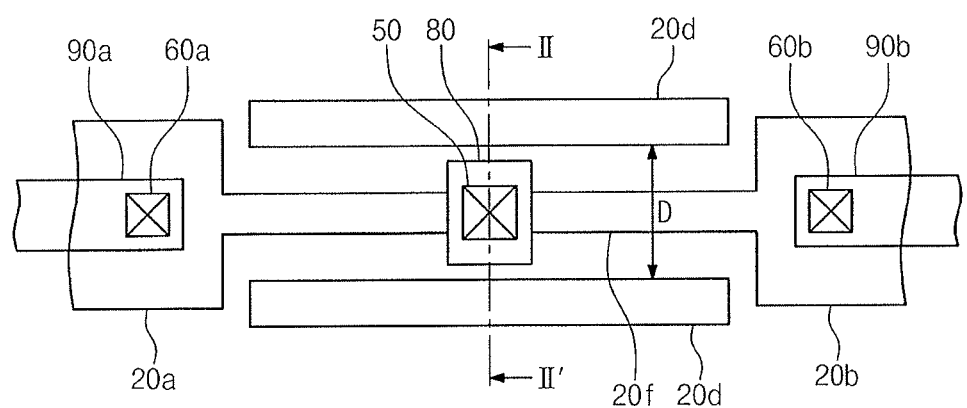
FIG. 17A illustrates a sixth embodiment of an e-fuse structure.
Figure 17B:
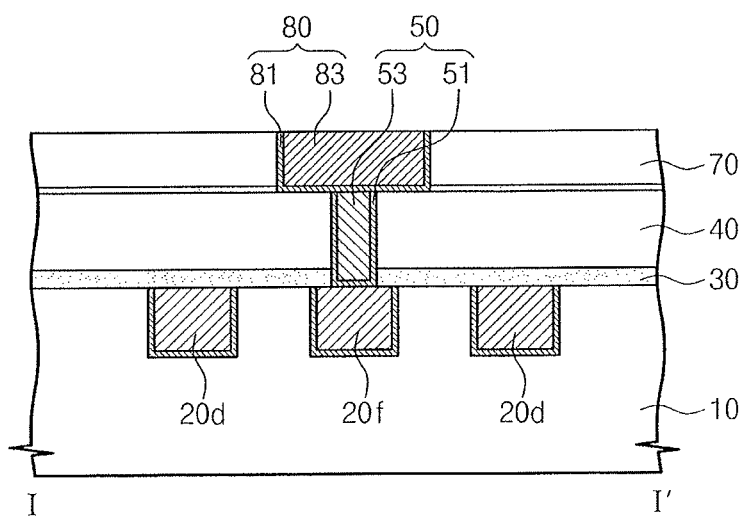
FIG. 17B illustrates a view along section lines I-I' and II-II' in FIG. 17A.

FIG. 17A illustrates a sixth embodiment of an e-fuse structure, and FIG. 17B illustrates a view taken along section lines I-I' and II-II' in FIG. 17A. Referring to FIGS. 17A and 17B, the e-fuse structure may include the metal layer 20 on the underlying layer 10, the capping dielectric 30 covering the top surface of the metal layer 20, and the interlayered insulating layer 40 on the capping dielectric 30. The metal layer 20 may form a cathode 20c, an anode 20a, and a fuse link 20f connecting the cathode 20c with the anode 20a as well as dummy fuse links 20d disposed at respective sides of the fuse link 20f. The dummy fuse links 20d may have, for example, substantially the same line width as the fuse link 20f and may extend parallel to the fuse link 20f. The dummy fuse links 20d may be spaced from the anode 20a, the cathode 20c, and the fuse link 20c.

The e-fuse structure may include the dummy metal plug 50 in contact with a portion of the fuse link 20f and the dummy metal pattern 80 on the dummy metal plug 50. A width of the dummy metal pattern 80 may be less than a space D between a pair of the dummy fuse links 20d adjacent thereto. The dummy metal plug 50 and the dummy metal pattern 80 may be concurrently formed, like the dummy metal plug 50 in FIGS. 9C and 10C. For example, the barrier metal layer 81 may not be formed between the metal layer 53 of the dummy metal plug 50 and the metal layer 83 of the dummy metal pattern 80.

Figure 18A:
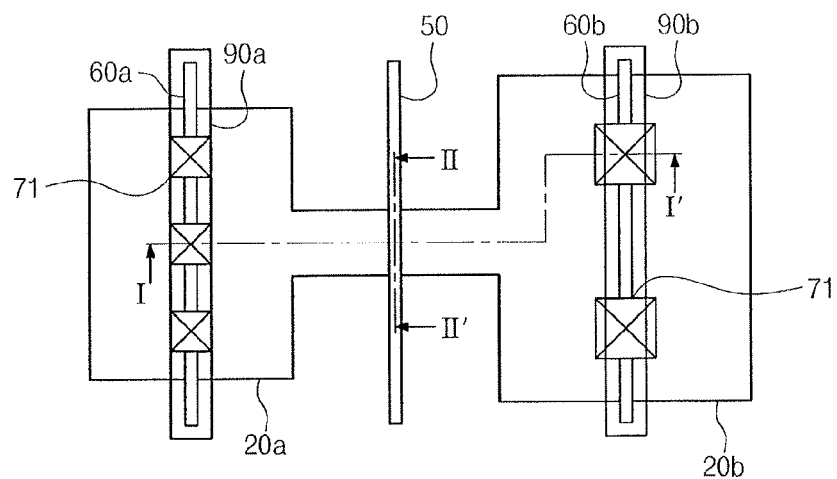
FIG. 18A illustrates a seventh embodiment of an e-fuse structure.
Figure 18B:
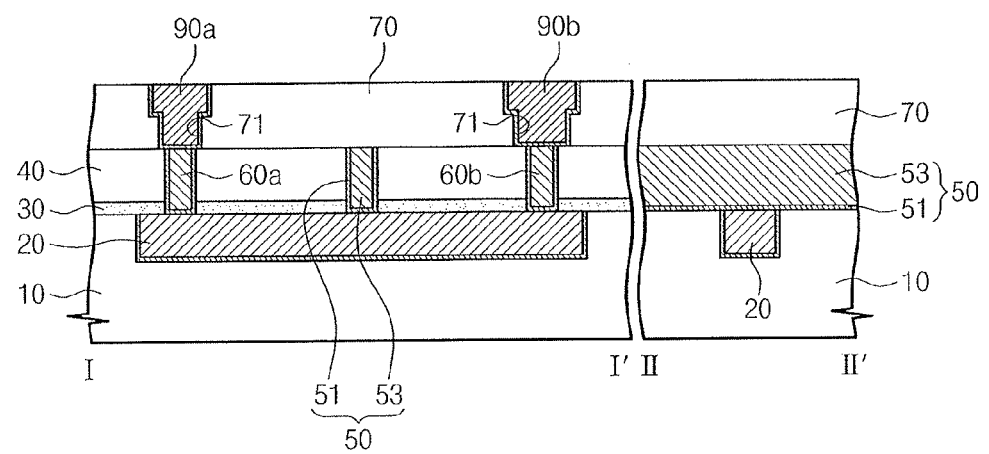
FIG. 18B illustrates a view along section lines I-I' and II-II' in FIG. 18A.

FIG. 18A illustrates a seventh embodiment of an e-fuse structure, and FIG. 18B illustrates a sectional view taken along lines I-I' and II-II' of FIG. 18A. The seventh embodiment of the e-fuse structure includes the metal layer 20 formed in the underlying layer 10, the capping dielectric 30 covering the top surface of the metal layer 20, and the interlayered insulating layer 40 on the capping dielectric 30. The metal layer 20 may be formed, for example, of a first metal material and may constitute the cathode 20c, the anode 20a, and the fuse link 20f connecting the cathode 20c with the anode 20a.

Further, the e-fuse structure may include the dummy metal plug 50 in contact with a portion of the fuse link 20f and the dummy metal pattern 80 on the dummy metal plug 50. The dummy metal plug 50 may extend along a direction substantially perpendicular to a longitudinal axis of the fuse link 20f. As described above, the dummy metal plug 50 may include the barrier metal layer 51 and the metal layer 53. The barrier metal layer 51 may be formed of a second metal material different from the first metal material, and the metal layer 53 may be formed of a third metal material different from the second metal material.

Further, the first contact plug 60a and the first conductive pattern 90a may be connected to the anode 20a. The second contact plug 60b and the second conductive pattern 90b may be connected to the cathode 20c. In the present embodiment, the first contact plug 60a and the second contact plug 60b may extend parallel to the dummy metal plug 50.

Further, in the present embodiment, the first and second conductive patterns 90a and 90b may be formed by forming the second interlayered insulating layer 70 on the first interlayered insulating layer 40 provided with the first and second contact plugs 60a and 60b and the dummy metal plug 50, forming a via hole 71 and a trench 73 in the second interlayered insulating layer 70, and sequentially forming second barrier metal layer and second metal layer in the via hole 71 and the trench 73. The top surface of the dummy metal plug 50 may be covered, for example, with the second interlayered insulating layer 70.

Figure 19:
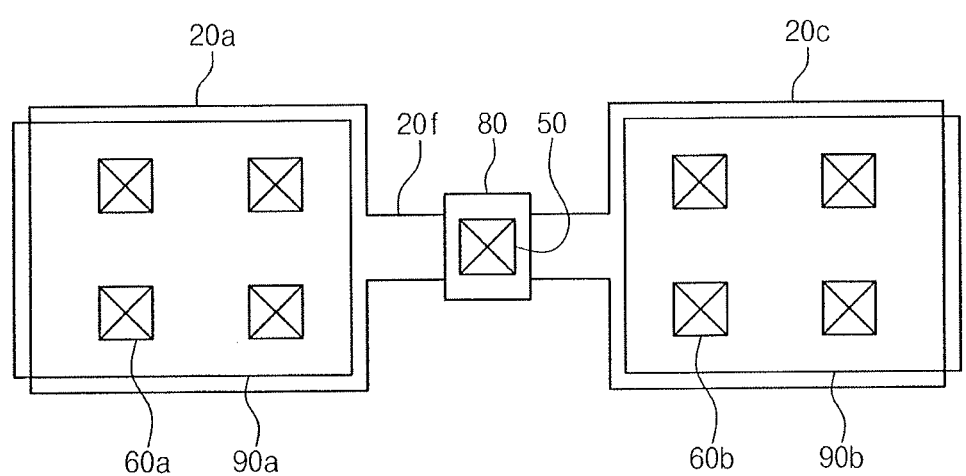
FIG. 19 illustrates a modification of the seventh embodiment of an e-fuse structure.

FIG. 19 illustrates a modification of the seventh embodiment of the e-fuse structure. Referring to FIG. 19, the e-fuse structure may include the metal layer 20 in the underlying layer 10, the capping dielectric 30 covering the top surface of the metal layer 20, and the interlayered insulating layer 40 on the capping dielectric 30. The metal layer 20 may be formed, for example, of a first metal material and may constitute the cathode 20c, the anode 20a, and the fuse link 20f connecting the cathode 20c with the anode 20a. Widths of the anode 20a and the cathode 20c may be greater than the fuse link 20f. The e-fuse structure may also include the dummy metal plug 50 in contact with a portion of the fuse link 20f and the dummy metal pattern 80 on the dummy metal plug 50.

In the present embodiment, a plurality of first contact plugs 60a may be connected to the anode 20a. The first conductive pattern 90a may be connected in common to the plurality of first contact plugs 60a. Similarly, a plurality of second contact plugs 60b may be connected to the cathode 20c, and the second conductive pattern 90b may be in common to the plurality of second contact plugs 60b.

FIGS. 20A, 20B, 21A, and 21B illustrate additional modifications of the seventh embodiment of e-fuse structure. Referring to FIGS. 20A, 20B, 21A, and 21B, this e-fuse structure may include the anode 20a, the cathode 20c, and the fuse link 20f connecting the cathode 20c with the anode 20a. The anode 20a, the cathode 20c, and the fuse link 20f may have substantially the same uniform line width.

Further, the e-fuse structure may include the dummy metal plug 50 in contact with a portion of the fuse link 20f. The dummy metal plug 50 may extend along a direction substantially perpendicular to a longitudinal axis of the fuse link 20f. The dummy metal plug 50 may include the barrier metal layer 51 and the metal layer 53. The barrier metal layer 51 may be formed of a second metal material different from the first metal material, and the metal layer 53 may be formed of a third metal material different from the second metal material.

Figure 20A:
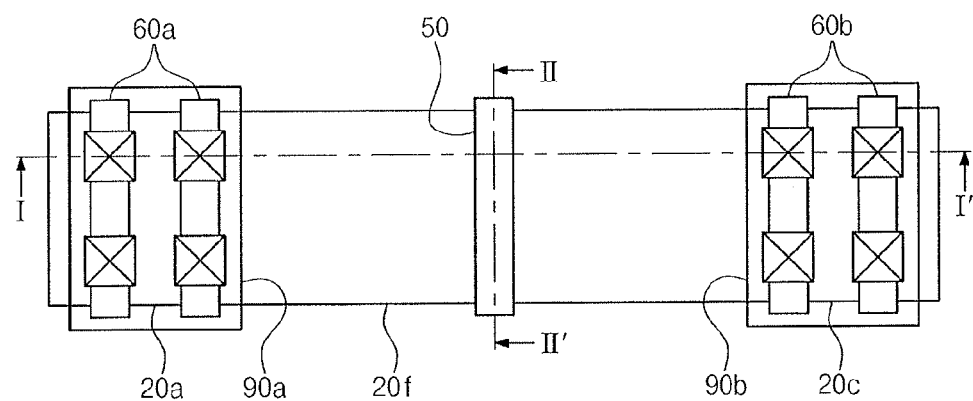
FIGS. 20A, 20B, 21A, and 21B illustrate modifications of the seventh embodiment of the e-fuse structure.
Figure 20B:
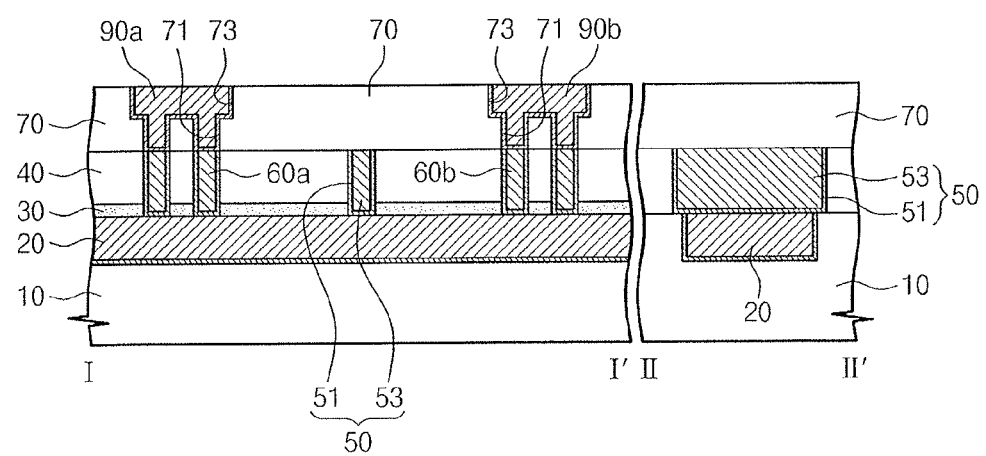

According to the embodiments in FIGS. 20A and 20B, a plurality of first contact plugs 60a may be connected to the top surface of the anode 20a, and a plurality of second contact plugs 60b may be connected to the top surface of the cathode 20c. Each of the first and second contact plugs 60a and 60b may have, for example, a bar shape, having a longitudinal axis perpendicular to that of the fuse link 20f. The first and second contact plugs 60a and 60b may be formed of the same material as the dummy metal plug 50.

The first conductive pattern 90a may be connected in common to the first contact plugs 60a. The second conductive pattern 90b may be connected in common to the second contact plugs 60b. The first conductive pattern 90a may be formed by forming a plurality of via holes 71 and a trench 73 connected to the via holes 71 in the second interlayered insulating layer 70, and then sequentially forming a barrier metal layer and a metal layer in the via holes 71 and the trench 73. The via holes 71 may be formed on respective first contact plugs 60a, and may be spaced from each other, for example, in first and second directions that cross each other. The second conductive pattern 90b may be formed in the same manner as the first conductive pattern 90a.

Figure 21A:
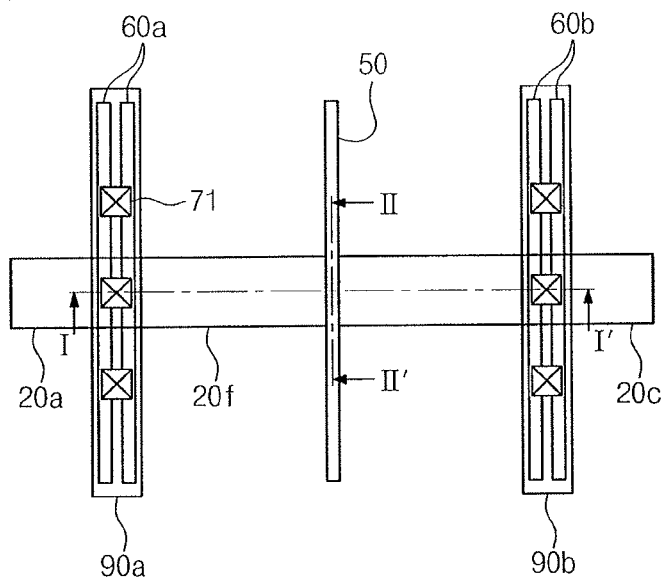
Figure 21B:
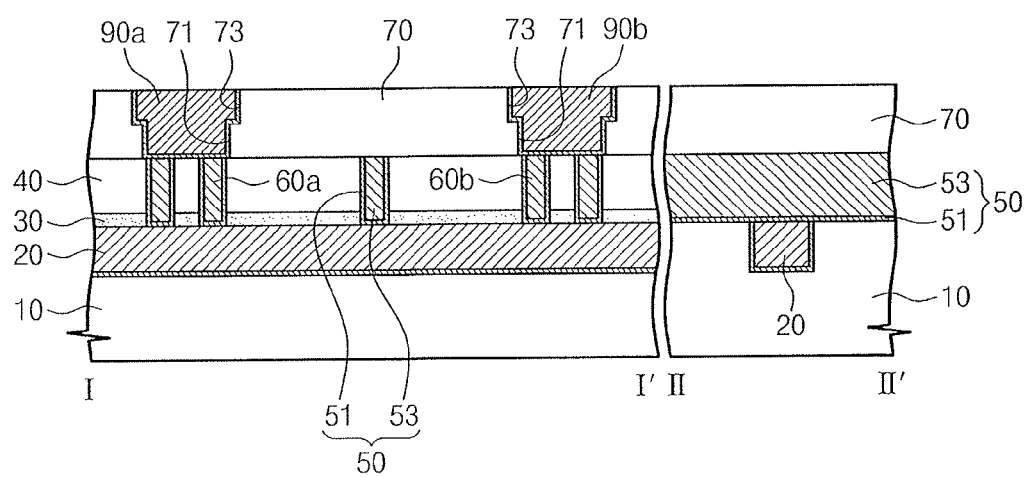

According to the embodiments in FIGS. 21A and 21B, a plurality of first contact plugs 60a may be connected to the anode 20a, and a plurality of second contact plugs 60b may be connected to the cathode 20c. The first conductive pattern 90a may be connected in common to the plurality of first contact plugs 60a. The second conductive pattern 90b may be connected in common to the plurality of second contact plugs 60b. In the present embodiment, the first and second contact plugs 60a and 60b may be substantially parallel to the dummy metal plug 50. For example, the first and second contact plugs 60a and 60b may extend along a direction that is substantially perpendicular to a longitudinal axis of the fuse link 20f.

The first and second conductive patterns 90a and 90b may be formed by forming a plurality of via holes 71 and a trench 73 connected to the via holes 71 in the second interlayered insulating layer 70, and then sequentially forming a barrier metal layer and a metal layer in the via holes 71 and the trench 73. The via holes 71 for the first conductive pattern 90a may be formed to expose the first contact plugs 60a adjacent to each other. The via holes 71 for the second conductive pattern 90b may be formed to expose the second contact plugs 60b adjacent to each other.

Figure 22:
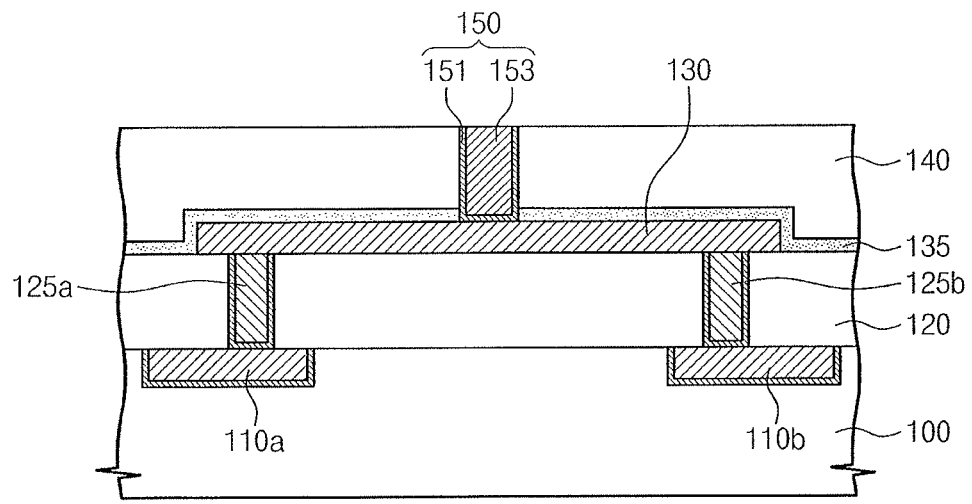
FIGS. 22 and 23 illustrate an eighth embodiment of an e-fuse structure.
Figure 23:
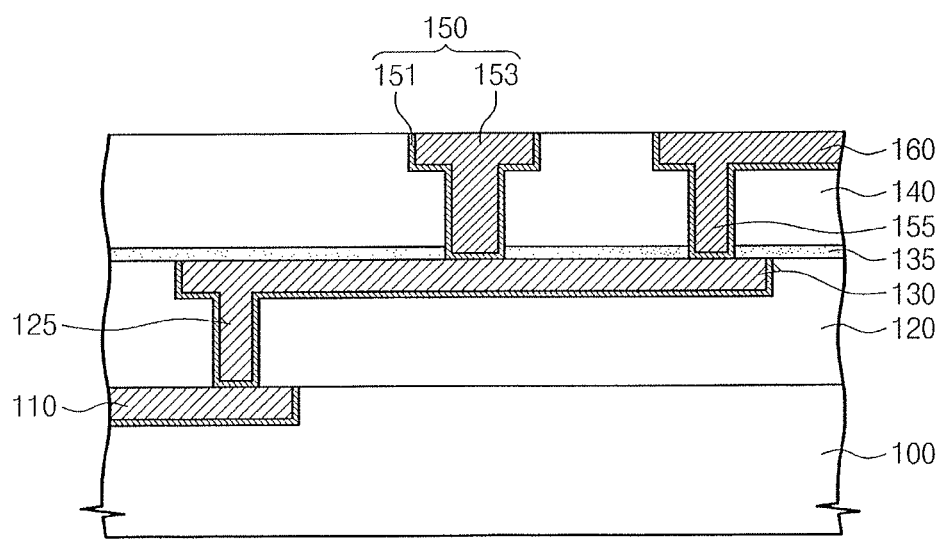

FIGS. 22 and 23 illustrate an eighth embodiment of an e-fuse structure which includes an anode pattern 110a, a cathode pattern 110b, a fuse link 130, a first contact plug 125a connecting the anode pattern 110a with the fuse link 130, a second contact plug 125b connecting the cathode pattern 110b with the fuse link 130, and a dummy metal plug 150 in contact with a portion of the fuse link 130. In this embodiment, the fuse link 130 may be at a different level from the anode pattern 110a and the cathode pattern 110b.

The anode pattern 110a and the cathode pattern 110b may be formed in the underlying layer 100, for example, by a damascene process and may be spaced from each other. The first contact plug 125a may be connected to the anode pattern 110a through a first interlayered insulating layer 120. The second contact plug 125b may be connected to the cathode pattern 110b through the first interlayered insulating layer 120.

The fuse link 130 may be formed by patterning a metal layer made of a first metal material, and may be provided on the first interlayered insulating layer 120. The fuse link 130 may be connected to both the first and second contact plugs 125a and 125b. A second interlayered insulating layer 140 may be on the first interlayered insulating layer 120 provided with the fuse link 130. A capping dielectric 135 may be interposed between the second interlayered insulating layer 140 and the fuse link 130.

The dummy metal plug 150 may penetrate the second interlayered insulating layer 140 and the capping dielectric 135, and may contact a portion of the fuse link 130. The dummy metal plug 150 may include a barrier metal layer 151 and a metal layer 153. The barrier metal layer 151 may be formed of a second metal material different from the first metal material constituting the fuse link 130. The metal layer 130 may be formed of a third metal material different from the second metal material.

Referring to FIG. 23, an anode pattern 110 may be provided on the underlying layer 100, the fuse link 130 may be provided at a first level relative to the underlying layer 100, and the cathode pattern 160 may be provided at a second level relative to the underlying layer 100. The second level may be higher than the first level.

For example, the first interlayered insulating layer 120 may be on the underlying layer 100 provided with the anode pattern 110. A first contact plug 125 may be connected to the anode pattern 110 through the first interlayered insulating layer 120. The fuse link 130 may be provided on the first contact plug 125. The fuse link 130 may be formed of a first metal material. The first contact plug 125 may be connected to an end portion of the fuse link 130. The fuse link 130 may be formed in the first interlayered insulating layer 120, for example, by a damascene process.

The capping dielectric 135 and the second interlayered insulating layer 140 may be sequentially formed on the fuse link 130. A second contact plug 155 may be connected to other end portion of the fuse link 130. The dummy metal plug 150 may be provided in a portion of the second interlayered insulating layer 140, which is spaced from the second contact plug 155. The dummy metal plug 150 may be concurrently formed with the second contact plug 155. Each of the dummy metal plug 150 and the second contact plug 155 may include the barrier metal layer 151 and the metal layer 153.

The barrier metal layer 151 may be formed of a second metal material different from the first metal material. The metal layer 153 may be formed of a third metal material different from the second metal material. In addition, the cathode pattern 160 may be provided in the second interlayered insulating layer 140, and may be connected to the second contact plug 155. The dummy metal plug 150 may include a contact portion and an interconnection portion.

Figure 24A:
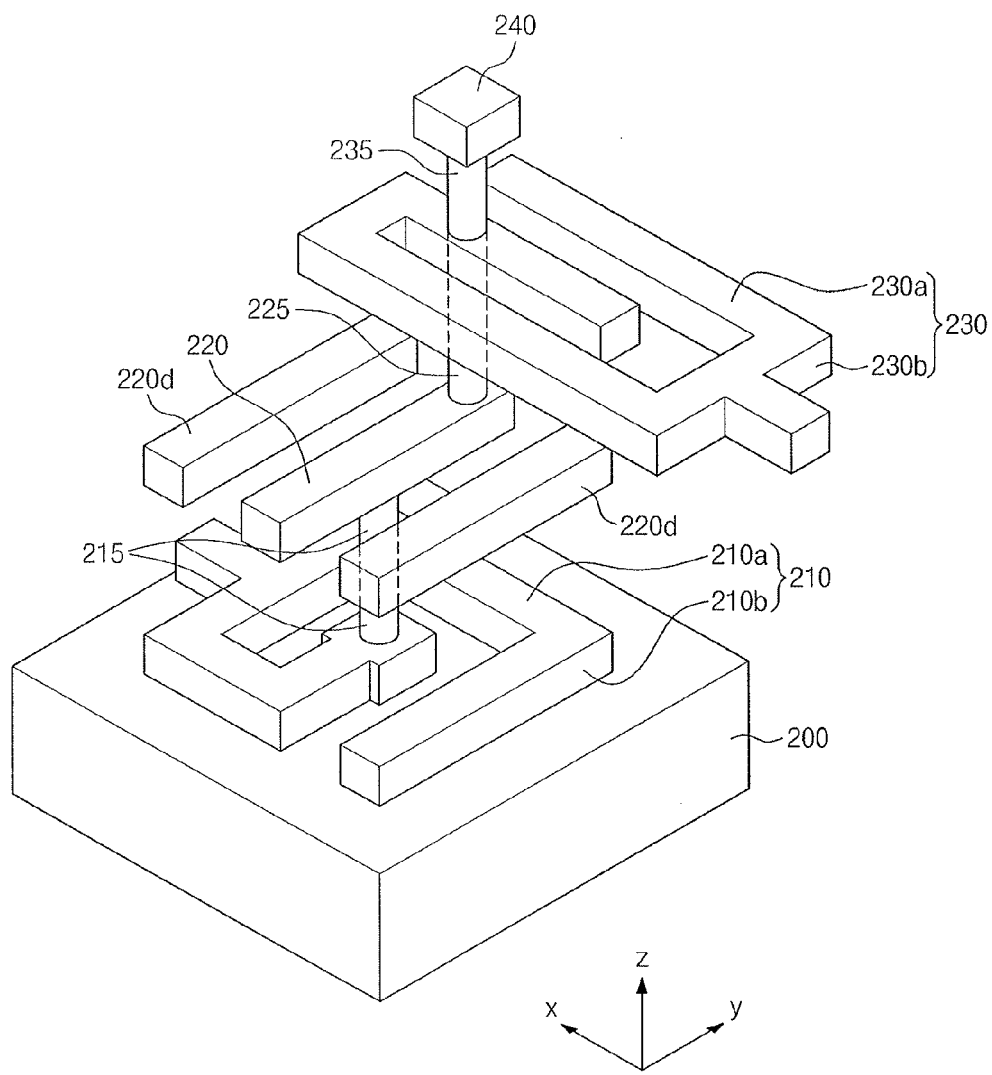
FIGS. 24A and 24B illustrate a ninth embodiment of an e-fuse structure.
Figure 24B:
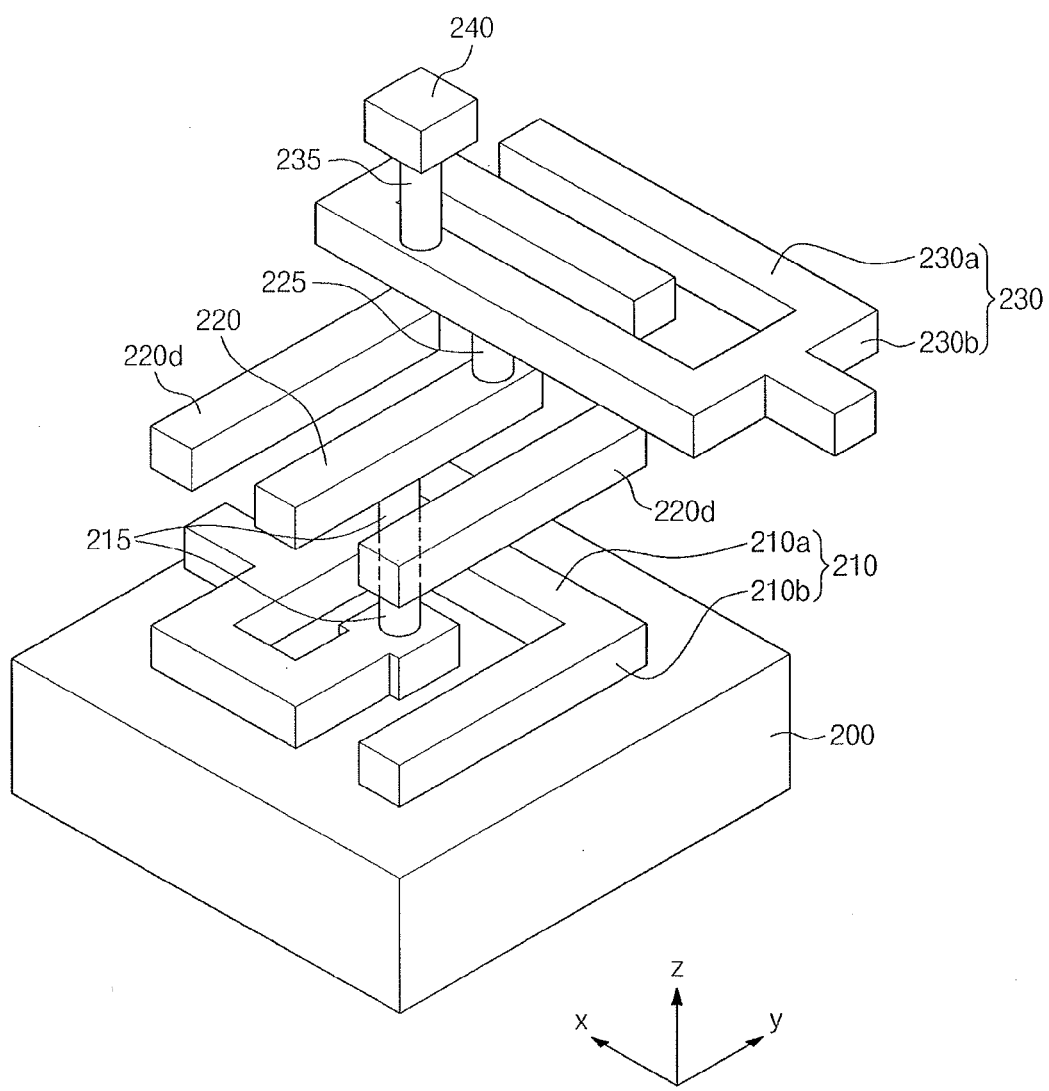

FIGS. 24A and 24B illustrate a ninth embodiment of an e-fuse structure which has a three-dimensional structure. The e-fuse structure may include a cathode pattern 210, a fuse link 220, and an anode pattern 230. The cathode pattern 210 may be on an underlying layer 200, the fuse link 220 may be at a first level relative to a top surface of the underlying layer 200, and the anode pattern 230 may be provided at a second level relative to the top surface of the underlying layer 200. The second level may be higher than the first level. In addition, dummy fuse links 220d may be provided at the same level as the fuse link 220.

In this embodiment, to effectively gather heat during a programming operation, the cathode pattern 210 may include first portions 210a extending in a first (e.g., x-axis) direction and second portions 210b extending in a second (e.g., y-axis) direction. A first contact plug 215 may connect the cathode pattern 210 to the fuse link 220.

Similar to the cathode pattern 210, the anode pattern 230 may include the first portions 230a extending along the first (e.g., x-axis) direction and the second portions 230b extending along the second (e.g., y-axis) direction. A second contact plug 225 may connect the fuse link 220 to the anode pattern 230. The first and second contact plugs 215 and 225 may not overlap each other, from a plan view.

The cathode pattern 210, the fuse link 220, and the anode pattern 230 may be formed of a first metal material including, for example, at least one of tungsten (W), aluminum (Al), copper (Cu), or copper alloys. Examples of copper alloys include copper-based materials, in which at least one of C, Ag, Co, Ta, In, Sn, Zn, Mn, Ti, Mg, Cr, Ge, Sr, Pt, Mg, Al, or Zr is contained in a small or predetermined amount.

The e-fuse structure may include a dummy metal plug 235 and a dummy metal pattern 240. The dummy metal plug 235 may contact a portion of the anode pattern 230. According to the embodiment in FIG. 24A, the dummy metal plug 235 may be connected to the first portion 230a of the anode pattern 230, and may be disposed adjacent to the second contact plug 225, from a plan view. In contrast, in FIG. 24B, the dummy metal plug 235 may be spaced from the second contact plug 225, from the perspective of a plan view.

The dummy metal plug 235 may include a barrier metal layer and a metal layer. The barrier metal layer may be formed of a second metal material different from the first metal material for the anode pattern 230. The metal layer may be formed of a third metal material different from the barrier metal layer. The second metal material may have an electrical conductivity lower than the first metal material. In addition, the dummy metal pattern 240 may be connected to the top surface of the dummy metal plug 235.

Use of the three-dimensional e-fuse structure in FIGS. 24A and 24B makes it possible to gather heat more effectively during the programming process, to thereby improve performance of the programming process. During the programming process, a negative voltage may be applied to the cathode pattern 210, a positive voltage may be applied to the anode pattern 230, and the dummy metal plug 235 and the dummy metal pattern 240 may be in an electrically floating state.

The voltage difference between the cathode pattern 210 and the anode pattern 230 produces a program current. As a result, electrons flow from the cathode pattern 210 toward the anode pattern 230 through the fuse link 220. The electron flow may change the electric and thermal driving forces at the anode pattern 230 below the dummy metal plug 235. Accordingly, a void may be formed at a portion of the anode pattern 230, which is adjacent to the dummy metal plug 235.

Figure 25A:
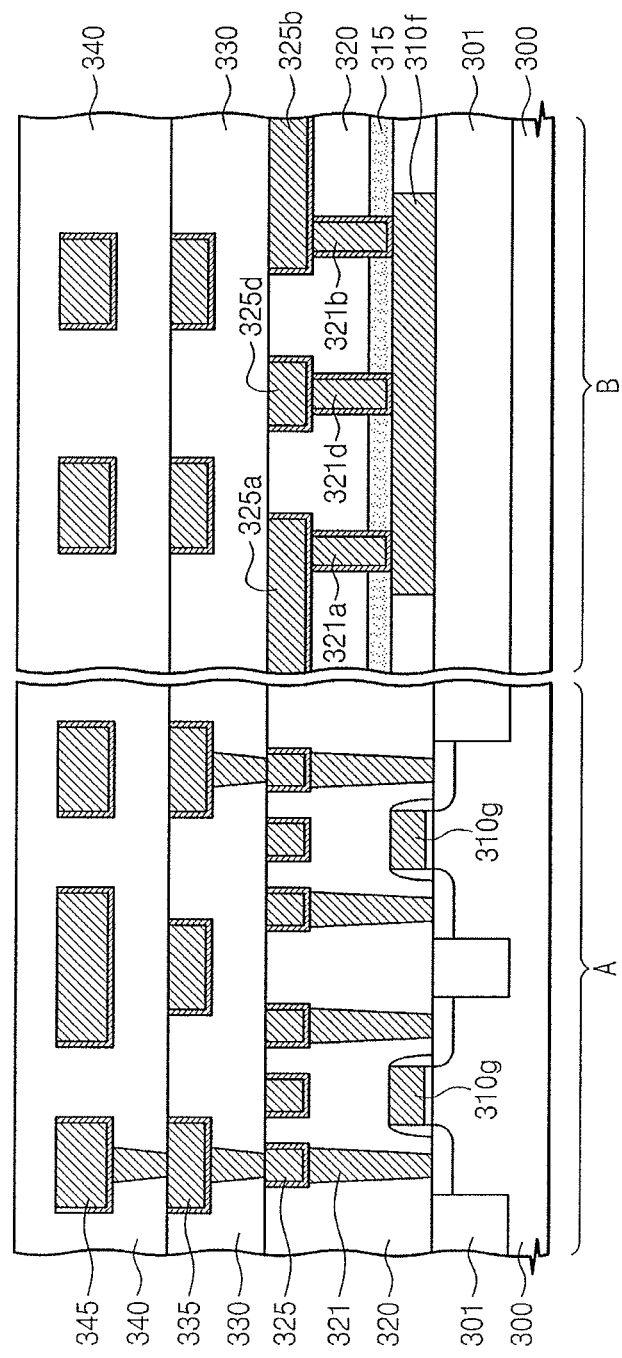
FIGS. 25A through 25C illustrate embodiments of semiconductor devices, each of which includes an e-fuse structure according to one or more of the aforementioned embodiments.
Figure 25B:
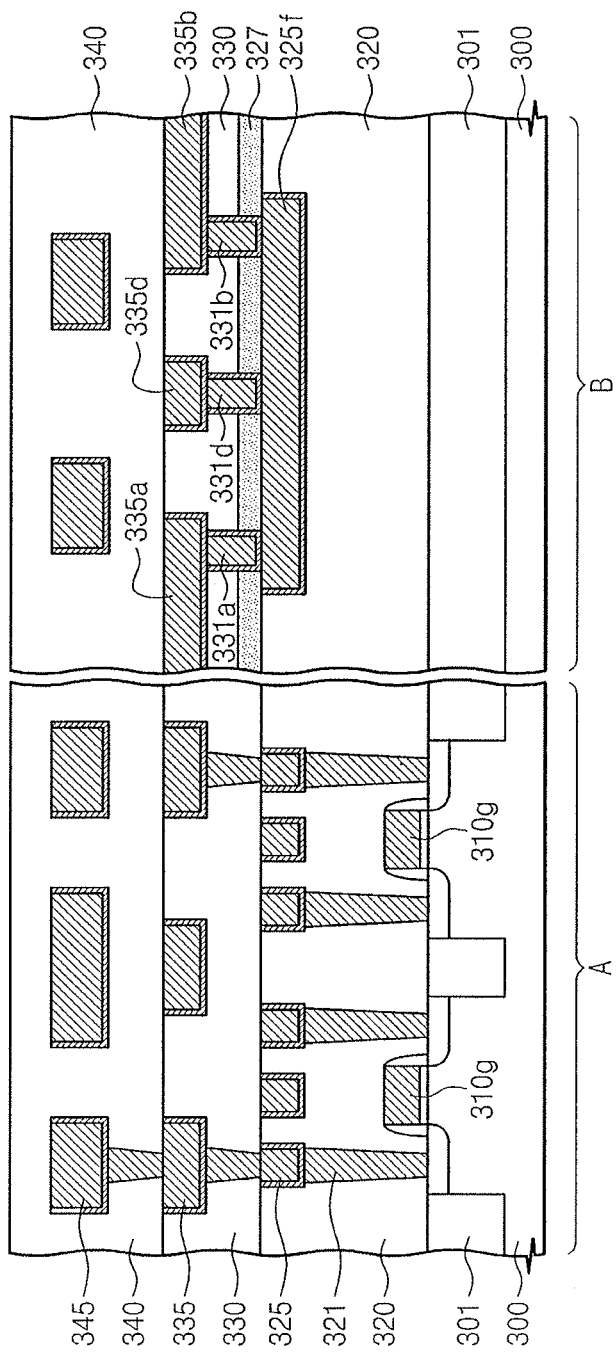
Figure 25C:
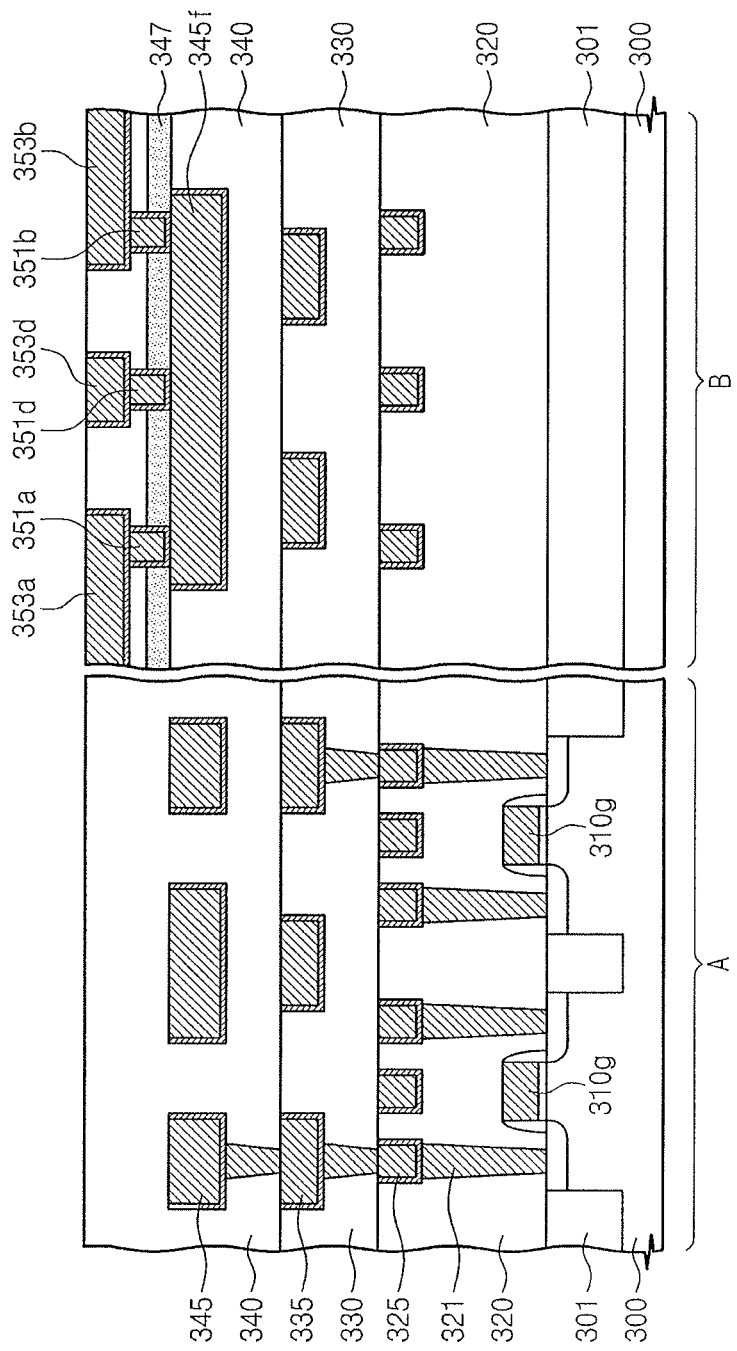

FIGS. 25A through 25C illustrate embodiments of semiconductor devices, each of which includes at least one e-fuse structure according to any of the aforementioned embodiments. Referring to FIGS. 25A through 25C, a semiconductor substrate 300 includes a memory cell region A and a fuse region B. MOS transistors are formed on the memory cell region A of the semiconductor substrate 300, and an e-fuse structure is formed on the fuse region B of the semiconductor substrate 300.

A device isolation layer 301 may be formed on the semiconductor substrate 300 to define active regions, and gate electrodes 310g may be formed to cross the active regions. Impurity regions may be formed in portions of the semiconductor substrate 300 at respective sides of the gate electrodes 310*g*. A first interlayered insulating layer 320 may be on the semiconductor substrate 300 provided with the MOS transistors and the e-fuse structure. Cell contact plugs 321 may be electrically connected to the MOS transistors through a first interlayered insulating layer 310.

First interconnection lines 325 may be provided on the first interlayered insulating layer 320 of the memory cell region A. Each of the first interconnection lines 325 may be electrically connected to at least one of the cell contact plugs 321. A second interlayered insulating layer 330 may be disposed on the first interlayered insulating layer. The second interconnection lines 335 may be disposed in the second interlayered insulating layer 330. The second interconnection lines 335 may have a line width greater than the first interconnection lines 325.

In addition, a third interlayered insulating layer 340 may be provided on the second interlayered insulating layer 330. Third interconnection lines 345 may be disposed in the third interlayered insulating layer 340. The third interconnection lines 345 may have a line width greater than the second interconnection lines 335.

According to the embodiment in FIG. 25A, a fuse link 310*f* may be formed on the device isolation layer 301 of the fuse region B, and a top surface of the fuse link 310*f* may be covered with a capping dielectric 315. The fuse link 310*f* may be concurrently formed with the gate electrodes 310*g* of the memory cell region A, and may be formed of a first metal material. The first metal material may be formed of at least one of tungsten (W), aluminum (Al), copper (Cu), or copper alloys). Examples of the copper alloys include copper-based materials, in which at least one of C, Ag, Co, Ta, In, Sn, Zn, Mn, Ti, Mg, Cr, Ge, Sr, Pt, Mg, Al, or Zr is contained in a small or predetermined amount.

In the fuse region B, first and second contact plugs 321*a* and 321*b* and a dummy metal plug 321*d* may be connected to the fuse link 310*f* through the first interlayered insulating layer 320. The dummy metal plug 321*d* may include the barrier metal layer and the metal layer. The barrier metal layer may be formed of the second metal material different from the first metal material. The metal layer may be formed of the third metal material. The dummy metal plug 321*d* may be concurrently formed with the cell contact plugs 321 of the memory cell region A.

First and second conductive patterns 325*a* and 325*b* and a dummy metal pattern 325*d* may be provided on the first interlayered insulating layer 320 of the fuse region B. The first conductive pattern 325*a* may be electrically connected to the first contact plug 321*a*, and the second conductive pattern 325*b* may be electrically connected to the second contact plug 321*b*. The dummy metal pattern 325*d* may contact a top surface of the dummy metal plug 321*d*. The first and second conductive patterns 325*a* and 325*b* and the dummy metal pattern 325*d* may be concurrently formed with the first interconnection lines 325 of the memory cell region A.

According to the embodiment in FIG. 25B, the e-fuse structure of the fuse region B may be concurrently formed with the first interconnection lines 325 of the memory cell region A. A fuse link 325*f* of the e-fuse structure may be formed on the first interlayered insulating layer 320 and spaced from the top surface of the semiconductor substrate 300. The first interconnection lines 325 and the fuse link 325*f* may be formed of a first metal material, and the top surface of the fuse link 325*f* may be covered with a capping dielectric 327.

In the fuse region B, first and second contact plugs 331*a* and 331*b* and a dummy metal plug 331*d* may be connected to the fuse link 310*f* through the second interlayered insulating layer 330 and the capping dielectric 327. The dummy metal plug 331*d* may include the barrier metal layer and the metal layer. The barrier metal layer is formed of a second metal material different from the first metal material. The metal layer is formed of a third metal material.

The first and second conductive patterns 335*a* and 335*b* and a dummy metal pattern 335*d* may be provided on the second interlayered insulating layer 330 of the fuse region B. The first conductive pattern 335*a* may be electrically connected to the first contact plug 331*a*, and the second conductive pattern 335*b* may be electrically connected to the second contact plug 331*b*.

According to the embodiment in FIG. 25C, the e-fuse structure of the fuse region B may be concurrently formed with the third interconnection lines 345 of the memory cell region A. The e-fuse structure may include a fuse link 345*f* spaced from the top surface of the semiconductor substrate 300. The third interconnection lines 345 and the fuse link 345*f* may be formed of a first metal material, and a top surface of the fuse link 345*f* may be covered with a capping dielectric 347.

In the fuse region B, first and second contact plugs 351*a* and 351*b* and a dummy metal plug 351*d* may be connected to the fuse link 345*f* through the third interlayered insulating layer 340 and the capping dielectric 347. The dummy metal plug 351*d* may include the barrier metal layer, which is formed of a second metal material different from the first metal material, and the metal layer, which is formed of a third metal material.

First and second conductive patterns 353*a* and 353*b* and a dummy metal pattern 353*d* may be provided on the third interlayered insulating layer 340 of the fuse region B. The first conductive pattern 353*a* may be electrically connected to the first contact plug 351*a*, and the second conductive pattern 353*b* may be electrically connected to the second contact plug 351*b*.

Figure 26:
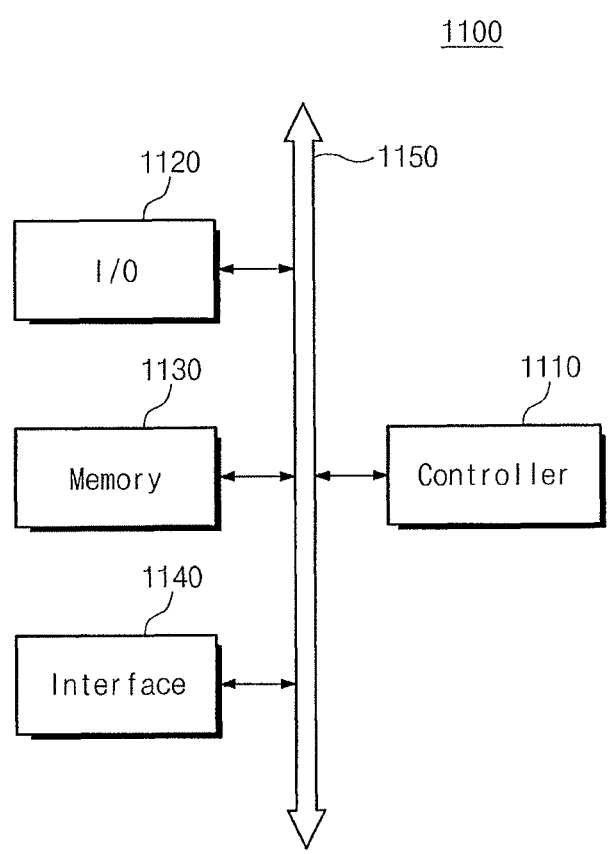
FIG. 26 illustrates a memory system which includes a semiconductor device according to one or more of the aforementioned embodiments.

FIG. 26 illustrates an embodiment of a memory system 1100 including a semiconductor device according to any of the aforementioned embodiments. Referring to FIG. 26, the memory system 1100 may be applied, for example, to a PDA (personal digital assistant), a portable computer, a web tablet, a wireless phone, a mobile phone, a digital music player, a memory card and/or all the devices that can transmit and/or receive data in a wireless communication environment.

The memory system 1100 includes a controller 1110, an input/output device 1120 (e.g., a keypad and/or a display device), a memory 1130, an interface 1140 and a bus 1150. The memory 1130 and the interface 1140 may communicate with each other through the bus 1150.

The controller 1110 may include a microprocessor, a digital signal processor, a micro controller and/or other process devices similar to the microprocessor, the digital signal processor and the micro controller. The memory 1130 may be used to store an instruction executed by the controller 1110. The input/output device 1120 may receive data and/or a signal from outside of the system 1100 and/or transmit data and/or a signal outside of the system 1100. For example, the input/output device 1120 may include a keyboard, a keypad and/or a display.

The memory 1130 may include a semiconductor device according to any of the aforementioned embodiments. The memory 1130 may further include a different kind of memory, e.g., a volatile memory device such as a random access memory and/or other kinds of memories. The interface 1140 may transmit data to a communication network and/or may receive data from a communication network.

Figure 27:
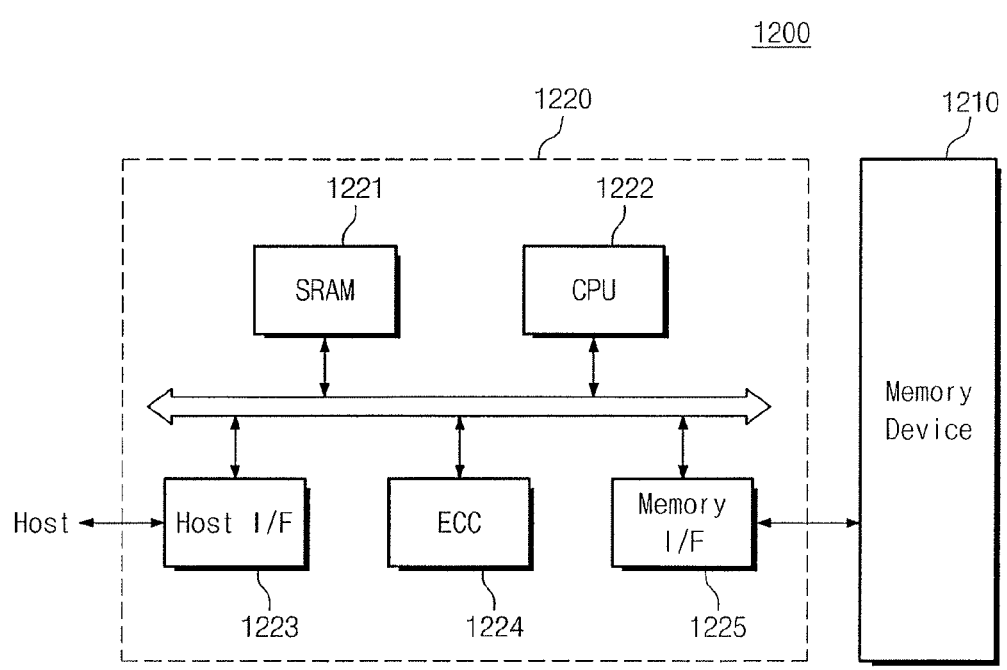
FIG. 27 illustrates a memory card which includes a semiconductor device according to one or more of the aforementioned embodiments.

FIG. 27 illustrates an embodiment of a memory card 1200 which includes a semiconductor device according to any of the aforementioned embodiments. Referring to FIG. 27, the memory card 1200 may have a large or other predetermined capacity storage capability and may include a semiconductor memory device 1210 according to any of the aforementioned embodiments. The memory card 1200 may include a memory controller 1220 that may control data exchanges between a host and the semiconductor memory device 1210.

A static random access memory (SRAM) 1221 may be used, for example, as an operation memory of a processing unit 1222. A host interface 1223 may include data exchange protocols of a host that may be connected to the memory card 1200. An error correction block 1224 may detect and/or correct errors in data readout from a multi-bit semiconductor memory device 1210.

A memory interface 1225 may interface with the semiconductor memory device 1210. The processing unit 1222 may perform control operations for exchanging data of the memory controller 1220. The memory card 1200 may include, for example, a ROM for storing code, instructions, or other information for interfacing with the host.

Figure 28:
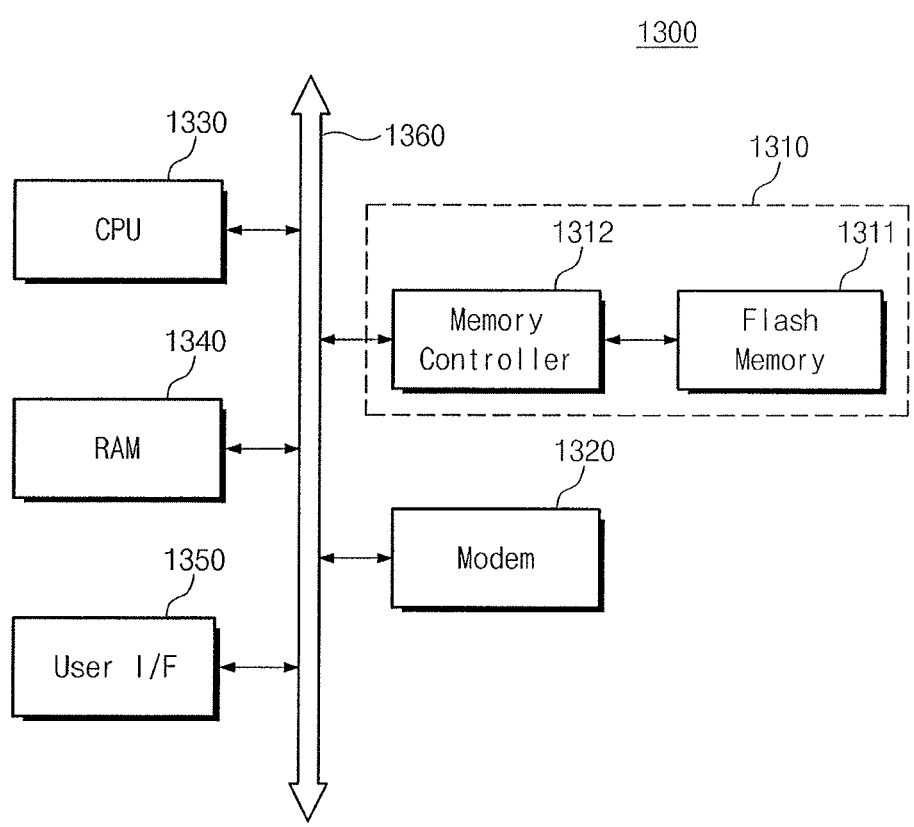
FIG. 28 illustrates an information processing system which includes a semiconductor device according to one or more of the aforementioned embodiments.

FIG. 28 illustrates an embodiment of an information processing system 1300 which includes a semiconductor device according to any of the aforementioned embodiments. Referring to FIG. 28, the information processing system 1300 includes a memory system 1310 having the semiconductor device.

The memory system 1310 may be mounted to an information processing system, which, for example, may be a mobile device and/or a desktop computer. The information processing system 1300 may include a modem 1320, a central processing unit (CPU) 1330, a RAM 1340, and a user interface 1350 electrically connected to a system bus 1360. The memory system 1310 may be configured in a manner similar to FIG. 20, and may include a semiconductor device 1311 and a memory controller 1312.

The memory system 1310 may be, for example, a solid state drive SSD, and may store data to be or that was processed by the CPU 1330 and/or data input from an external source. The information processing system 1300 may reliably store a large or predetermined amount of data in the memory system 1310. The memory system 1310 may conserve resources for error correction, and may also provide for a high speed data exchange function. In one embodiment, the information processing system 1300 may include an application chipset, a camera image processor (CIS), and/or an input/output device.

In accordance with one or more of the aforementioned embodiment, an e-fuse structure includes a dummy metal plug attached to a fuse link. The fuse link may be formed of a first metal material, and the dummy metal plug may include a second metal material. Accordingly, during a programming process of the e-fuse structure, a temperature gradient of the fuse link and a driving force caused by electro-migration may be controlled to increase a total driving force applied to the fuse link. As a result, the e-fuse structure may be programmed by a reduced operation voltage.

In accordance with one or more of the aforementioned embodiments, the total driving force applied to the fuse link may be controlled by adjusting the volume or contact area of the dummy metal plug, and/or the number of dummy metal plugs. In addition, the position of the dummy metal plug may be adjusted to control the position of a void to be formed in the programming process of the e-fuse structure.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An e-fuse structure of a semiconductor device, comprising:
    a fuse link of a first metal material to connect a cathode and an anode;
    a capping dielectric covering a top surface of the fuse link; and
    a dummy metal plug penetrating the capping dielectric and contacting the fuse link, the dummy metal plug including a barrier metal layer between a metal layer and the fuse link, wherein the barrier metal layer includes a second metal material different from the first metal material,
    wherein the fuse link has a width that is substantially equal to or smaller than widths of the anode and the cathode.

2. The e-fuse structure as claimed in claim 1, further comprising:
    a dummy metal pattern on a top surface of the dummy metal plug; and
    dummy fuse links at respective sides of the fuse link,
    wherein the dummy metal pattern has a thickness greater than the fuse link and a width less than a distance between the dummy fuse links.

3. The e-fuse structure as claimed in claim 1, wherein a plurality of dummy metal plugs are between the anode and the cathode.

4. The e-fuse structure as claimed in claim 1, wherein the dummy metal plug extends along a direction that is substantially perpendicular to a longitudinal axis of the fuse link.

5. The e-fuse structure as claimed in claim 1, wherein:
    the fuse link is to carry program current, and
    the dummy metal plug changes a temperature gradient in the fuse link when the fuse link carries the program current.

6. The e-fuse structure as claimed in claim 5, wherein:
    the fuse link includes a first region in contact with the dummy metal plug and a second region in contact with the capping dielectric, and
    a temperature of the fuse link has a maximum value at the second region when the fuse link carries the program current.

7. The e-fuse structure as claimed in claim 1, wherein:
    the fuse link includes a first region in contact with the dummy metal plug and a second region in contact with the capping dielectric,
    the e-fuse structure is to carry program current , and
    during supply of the program current, a first electrical driving force caused by electro-migration at the first region of the fuse link is different from a second electrical driving force caused by electro-migration at the second region of the fuse link.

8. An e-fuse structure of a semiconductor device, comprising:
    a fuse link of a first metal material to connect a cathode with an anode;

an interlayered insulating layer covering the anode, the cathode, and the fuse link;

a capping dielectric between a top surface of the fuse link and the interlayered insulating layer, the capping dielectric including an insulating material different from the interlayered insulating layer; and a dummy metal plug penetrating the interlayered insulating layer and the capping dielectric and contacting the fuse link, the dummy metal plug including a barrier metal layer between a metal layer and the fuse link, wherein the barrier metal layer includes a second metal material different from the first metal material, wherein the barrier metal layer covers bottom and side surfaces of the metal layer.

9. The e-fuse structure as claimed in claim 8, wherein:
the first metal material includes at least one of tungsten, aluminum, copper, or copper alloys, and the second metal material includes at least one of Ta, TaN, TaSiN, Ti, TiN, TiSiN, W, WN, or a combination thereof.

10. The e-fuse structure as claimed in claim 8, wherein the barrier metal layer is thicker on the bottom surface of the metal layer than on the side surfaces of the metal layer.

11. The e-fuse structure as claimed in claim 8, wherein:
the fuse link is to carry program current, and
the fuse link has a void between the anode and the dummy metal plug in a programmed state.

12. The e-fuse structure as claimed in claim 11, wherein a distance between the void and the dummy metal plug is less than a distance between the void and the anode.

13. An e-fuse structure of a semiconductor device, comprising:
a fuse link to connect an anode to a cathode and to be programmed based on a program current; and
a dummy metal plug in contact with the fuse link,
wherein the fuse link includes a first metal material, the dummy metal plug includes a second metal material different from the first metal material, and the dummy metal plug changes electrical and thermal driving forces when the fuse link carries the program current, wherein the electrical and thermal driving forces are based on electro-migration and thermo-migration in the fuse link.

14. The e-fuse structure as claimed in claim 13, wherein:
the dummy metal plug includes a barrier metal layer between a metal layer and the fuse link, and
the barrier metal layer includes the second metal material.

15. The e-fuse structure as claimed in claim 13, wherein the first metal material has electrical conductivity greater than the second metal material.

16. The e-fuse structure as claimed in claim 13, wherein:
a total driving force has a maximum value between the anode and the dummy metal plug when the fuse link carries the program current, and
the total driving force is based on a sum of the electrical and thermal driving forces.

17. The e-fuse structure as claimed in claim 13, further comprising:
an interlayered insulating layer covering the anode, the cathode, and the fuse link; and
a capping dielectric between a top surface of the fuse link and the interlayered insulating layer, the capping dielectric including an insulating material different from the interlayered insulating layer, wherein the fuse link includes a first region in contact with the dummy metal plug and a second region in contact with the capping dielectric.

18. The e-fuse structure as claimed in claim 17, wherein a first electrical driving force caused by electro-migration at the first region of the fuse link is less than a second electrical driving force caused by electro-migration at the second region of the fuse link.

19. The e-fuse structure as claimed in claim 18, wherein a temperature of the fuse link has a maximum value at the second region when the fuse link carries the program current.

* * * * *